(12) United States Patent
Matsuoka et al.

(10) Patent No.: US 6,696,732 B2
(45) Date of Patent: Feb. 24, 2004

(54) SEMICONDUCTOR DEVICE HAVING S/D TO S/D CONNECTION AND ISOLATION REGION BETWEEN TWO SEMICONDUCTOR ELEMENTS

(75) Inventors: Takeru Matsuoka, Tokyo (JP); Shoichi Fukui, Tokyo (JP); Takeshi Masamitsu, Hyogo (JP)

(73) Assignees: Mitsubishi Denki Kabushiki Kaisha, Tokyo (JP); Ryoden Semiconductor System Engineering Corporation, Itami (JP)

( * ) Notice: Subject to any disclaimer, the term of this patent is extended or adjusted under 35 U.S.C. 154(b) by 0 days.

(21) Appl. No.: 10/192,610

(22) Filed: Jul. 11, 2002

(65) Prior Publication Data

US 2003/0080429 A1 May 1, 2003

(30) Foreign Application Priority Data

Nov. 1, 2001 (JP) ......................... 2001-336627

(51) Int. Cl.[7] .................. H01L 29/94; H01L 31/062
(52) U.S. Cl. ........................ 257/365; 257/903
(58) Field of Search ................... 257/365, 903

(56) References Cited

U.S. PATENT DOCUMENTS 6,127,704 A * 10/2000 Kim ........................ 257/365

FOREIGN PATENT DOCUMENTS

JP 06-112408 4/1994
JP 08-316320 11/1996

OTHER PUBLICATIONS

"Semiconductor Device, Physics and Technology", Library of Congress Cataloging in Publication Data, 1985, p. 492.

* cited by examiner

Primary Examiner—Hoai Ho
Assistant Examiner—Tu-Tu Ho
(74) Attorney, Agent, or Firm—Burns, Doane, Swecker & Mathis, LLP.

(57) ABSTRACT

A plurality of MOS type FET devices 14 and 16 are provided on a semiconductor substrate 12. A lower interlayer insulating film 20 is provided thereon. Each of through holes 22, which extends from each of gate electrodes 14c of the plural FET devices via source/drain regions 14b and 16a, is defined in the lower interlayer insulating film 20. A local wiring 24 is buried in the through hole 22 to connect each gate electrode 14c and the source/drain regions 14b and 16a. Further, an upper interlayer insulating film 26 is provided on the local wiring 24 and the lower interlayer insulating film 20. Upper electrode layers 28 are placed on the surface of the upper interlayer insulating film 26.

7 Claims, 13 Drawing Sheets

US 6,696,732 B2

SEMICONDUCTOR DEVICE HAVING S/D TO S/D CONNECTION AND ISOLATION REGION BETWEEN TWO SEMICONDUCTOR ELEMENTS

BACKGROUND OF THE INVENTION

1. Field of the Invention

The present invention relates to a semiconductor device, and particularly to a structure for connecting semiconductor elements of a semiconductor integrated circuit and wiring layers.

2. Description of the related Art

A semiconductor integrated circuit has recently been moved toward increasingly greater densities, and the tendency has been toward further narrowing of the width of each wiring and the interval between the wirings. The development thereof has been put forward with the aim of obtaining an integrated circuit device whose design rule is of a 0.15 µm-class.

FIG. 30 is a partly see-through plan view of a conventional integrated circuit device. FIG. 31 is a cross-sectional view of the conventional integrated circuit device as viewed in the form of a section taken along line XXXI—XXXI of FIG. 30.

In FIGS. 30 and 31, reference numeral 200 indicates a semiconductor integrated circuit, e.g., an SRAM, i.e., a partial CMOS thereof herein. Reference numeral 202 indicates a silicon substrate, reference numeral 204 indicates an NMOS constituting the semiconductor integrated circuit 200, reference numerals 204a and 204b indicate source/drain regions of the NMOS 204, and reference numeral 204c indicates a gate electrode of the NMOS 204. In FIG. 31, reference numeral 204d indicates a gate insulating film of the NMOS 204, and reference numeral 204e indicates an active region lying between the source/drain regions 204a and 204b.

Reference numeral 206 indicates a PMOS constituting the semiconductor integrated circuit 200, reference numerals 206a and 206b indicate source/drain regions of the PMOS 206, and reference numeral 206c indicates a gate electrode of the PMOS 206. In FIG. 31, reference numeral 206d indicates a gate insulating film of the PMOS 206, and reference numeral 206e indicates an active region lying between the source/drain regions 206a and 206b.

In FIG. 31, reference numerals 208 indicate isolating oxide films, reference numeral 210 indicates an etching stopper layer, and reference numeral 212 indicates an interlayer insulating film. In FIGS. 30 and 31, reference numerals 214 indicate contact holes, reference numerals 214a, 214b, 214c, 214d and 214e indicate connecting conductors for the contact holes, and reference numerals 216 (216a, 216b and 216c) indicate wiring layers.

Incidentally, FIG. 30 is illustrated with the etching stopper layer 210 and the interlayer insulating film 212 being omitted therefrom.

FIG. 32 is a partly see-through plan view of another conventional integrated circuit device. FIG. 33 is a cross-sectional view of the conventional integrated circuit device as viewed in the form of a section taken along XXXIII—XXXIII of FIG. 32.

In FIGS. 32 and 33, reference numeral 220 indicates a semiconductor integrated circuit, e.g., Flash (non-volatile memory) comprised of an NMOS, i.e., a part thereof herein.

In FIGS. 32 and 33, the same reference numerals as those shown in FIGS. 30 and 31 respectively indicate the same or equivalent ones. They are similar even in the case of the following individual drawings.

Reference numerals 222 indicate connecting diffusion regions, which are used to connect source regions of individual NMOSs to one another for the purpose of holding ones of the source/drain regions of NMOSs 204, e.g., the source regions at equal potentials. In FIG. 32, the connecting diffusion regions 222 are diagonally shaded to clearly define the differences between the same regions and other portions without being intended for the representation of the section. Reference numerals 224 (224a, 224b and 224c) indicate wiring layers.

FIG. 32 is illustrated with an etching stopper layer 210 and an interlayer insulating film 212 being omitted therefrom.

In each of the semiconductor integrated circuit 200 and the semiconductor integrated circuit 220 respectively having such structures, the connecting conductors 214a, 214b, 214c, 214d and 214e of the contact holes 214, which are respectively connected to the source/drain regions 204a, 204b, 206a and 206b and the gate electrodes 204c provided on the silicon substrate 202, and the wiring layers 216 are formed of a complex film of a high melting-point metal comprising a titanium film, a titanium nitride film and a tungsten film in the same process.

However, the metal wirings for forming the connecting conductors 214a, 214b, 214c, 214d and 214e and the wiring layers 216 in the same process by using the complex film formed of such a high melting-point metal have a problem that a phenomenon occurs wherein when a design rule reaches 0.15 µm or less, an etching gas for dry etching is hard to reach a narrow etching region between the wirings with a decrease in etching width between the wirings, thus causing the inconvenience that each etching residual of the high melting-point metal takes place.

Further, the semiconductor integrated circuit 220 needs to connect the sources of the respective NMOSs for the purpose of holding ones of the source/drain regions of the respective arranged NMOSs 204, e.g., the sources at equal potentials. However, they are connected to one another by the connecting diffusion regions 222 because it is hard to provide the wiring layers in parallel with the gate electrodes 204c. However, there is a possibility that the connections thereof by the connecting diffusion regions 222 will cause inconvenience that a resistance value suddenly increases when the width of each connecting diffusion region 222 becomes narrow, and when a source resistance increases, device characteristics such as a reduction in the speed due to an increase in time constant, a reduction in the drive current of each transistor, etc. will be degraded. For instance, a method of implanting an impurity to each source region in high concentrations is also considered. However, the present method is accompanied by a problem that a leak characteristic of a pn junction is degraded.

Incidentally, Japanese Patent Laid-Open No. Hei 6(1994)-112408, Japanese Patent Laid-Open No. 2000-22080 and Japanese Patent Laid-Open No. Hei 8(1996)-316320 respectively have described an example of a MISFET having an interlayer insulating film provided as one layer and having a structure wherein a gate electrode and a source region are electrically connected to each other.

SUMMARY OF THE INVENTION

The present invention has been made to solve the foregoing problems. It is an object of the present invention to provide a semiconductor device equipped with a plurality of MOS type elements, which has such a configuration that even if a design rule is rendered small, the interval between wiring layers on an interlayer insulating film can be widened.

According to one aspect of the invention, there is provided a semiconductor device comprising: a semiconductor substrate having one main surface; a first semiconductor element having source and drain regions provided on the main surface of the semiconductor substrate, and a gate electrode provided on an active region lying between the source and drain regions with an insulating film interposed therebetween; a second semiconductor element provided with each of isolation regions being interposed between the first semiconductor element and the second semiconductor element, having source and drain regions provided on the main surface of the semiconductor substrate, and a gate electrode provided on an active region lying between the source and drain regions with an insulating film interposed therebetween; a first insulating film which is provided on the semiconductor substrate with the first and second semiconductor elements interposed therebetween and has a through hole extending via the source region or drain region of the first semiconductor element and the source region or drain region of the second semiconductor element; a first wiring layer which is buried in the through hole of the first insulating film and connects the source region or drain region of the first semiconductor element and the source region or drain region of the second semiconductor element; and a second insulating film which covers the first wiring layer and is provided on the first insulating film, and which has a surface on which second wiring layers are provided.

Accordingly, present invention enables to prevent a yield reduction due to the failure of the formation of each second wiring layer, since the first wiring layer connecting the source region or drain region of the first semiconductor element and the source region or drain region of the second semiconductor element is covered with the second insulating film the wiring-to-wiring pitch between the second wiring layers can be rendered wide. In its turn, an inexpensive and high-reliable semiconductor device can be constructed.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the substantially same elements are given the same reference numbers.

DESCRIPTION OF THE PREFERRED EMBODIMENTS

In a semiconductor device according to the present embodiment, a plurality of MOS type FET elements is disposed on a semiconductor substrate. An interlayer insulating film corresponding to a first layer is provided on the plurality of MOS type FET elements. Through holes, which extend via source regions and drain regions, or via source regions and source regions, or via drain regions and drain regions, of the plurality of FET devices, are defined in the interlayer insulating film corresponding to the first layer. A first wiring layer is buried in each of the through holes to connect the source/drain region respectively. Further, an interlayer insulating film corresponding to a second layer is disposed on the first wiring layer and the interlayer insulating film corresponding to the first layer, and second wiring layers are provided on the surface of the interlayer insulating film corresponding to the second layer.

First Embodiment

Figure 1:
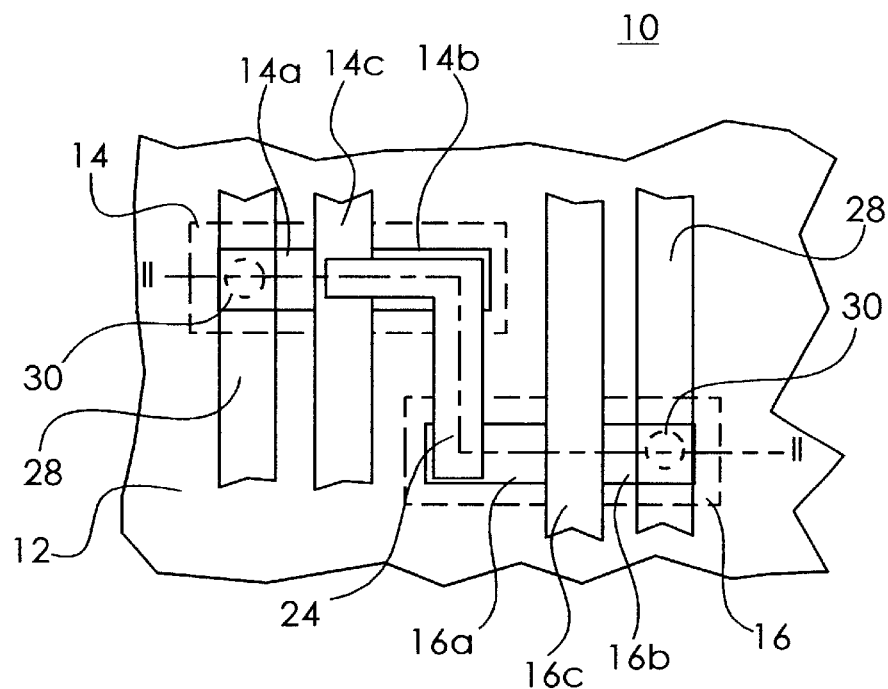
FIG. 1 is a partly see-through plan view of an integrated circuit device according to an embodiment of the present invention.
Figure 2:
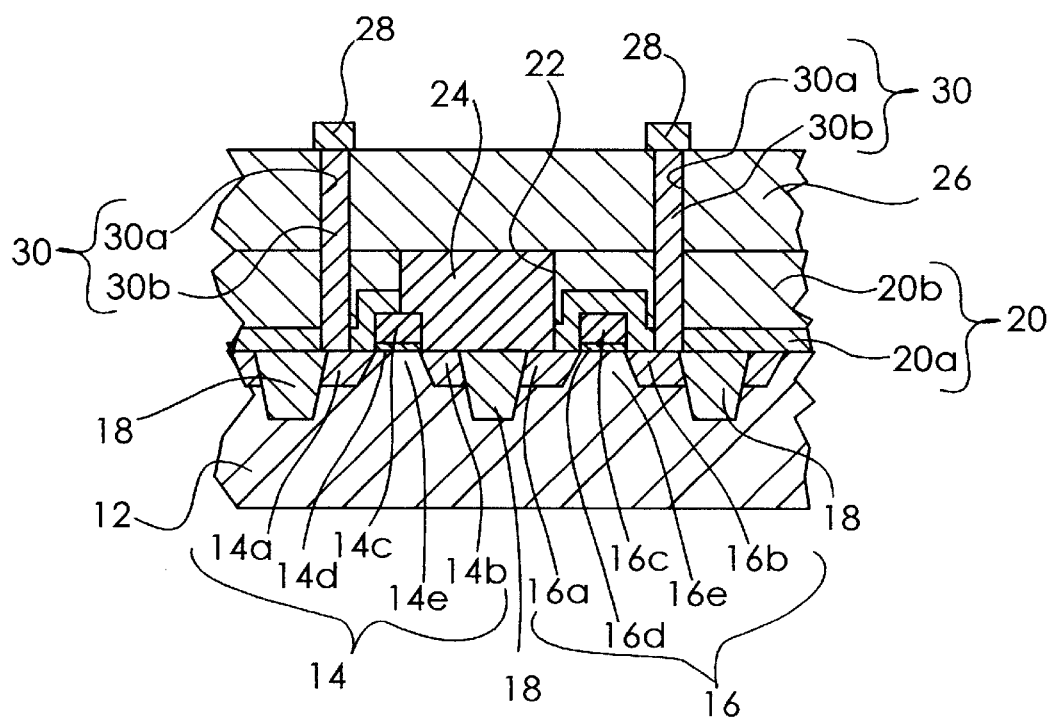
FIG. 2 is a cross-sectional view of the integrated circuit device according to an embodiment of the present invention as viewed from a section taken along line II—II of FIG. 1.

FIG. 1 is a partly see-through plan view of an integrated circuit device according to a first embodiment. FIG. 2 is a cross-sectional view of the integrated circuit device according to the first embodiment as viewed from a section taken along line II—II of FIG. 1.

In FIGS. 1 and 2, reference numeral 10 indicates a semiconductor integrated circuit, e.g., an SRAM, i.e., a partial CMOS thereof herein. Reference numeral 12 indicates a p type silicon substrate, reference numeral 14 indicates, for example, an NMOS used as a first semiconductor element or elemental device which constitutes the semiconductor integrated circuit 10, reference numerals 14a and 14b respectively indicate source/drain regions corresponding to impurity regions each formed by forming a P well (not shown) in the silicon substrate 12 and implanting N-type dopants therein, and reference numeral 14c indicates a gate electrode of the NMOS 14. In FIG. 2, reference numeral 14d indicates a gate insulating film of the NMOS 14, and reference numeral 14e indicates an active region lying between the source/drain regions 14a and 14b.

Reference numeral 16 indicates, for example, a PMOS used as a second semiconductor element or elemental device which constitutes the semiconductor integrated circuit 10, reference numerals 16a and 16b respectively indicate source/drain regions corresponding to impurity regions each obtained by forming an N well (not shown) in the silicon substrate 12 and implanting P-type dopants in the N well, and reference numeral 16c indicates a gate electrode of the PMOS 16. In FIG. 2, reference numeral 16d indicates a gate insulating film of the PMOS 16, and reference numeral 16e indicates an active region lying between the source/drain regions 16a and 16b. Reference numerals 18 respectively indicate isolating oxide films for isolating the elements from one another.

In FIGS. 1 and 2, reference numeral 20 indicates a lower interlayer insulating film used as a first insulating film. In the first embodiment, the lower interlayer insulating film 20 comprises a first lower interlayer insulating film 20a, which functions as an etching stopper layer, provided on the lower side thereof and a second lower interlayer insulating film 20b provided on the upper side thereof. The first lower interlayer insulating film 20a is a silicon nitride film having a layer thickness that ranges from 200 angstroms to 500 angstroms, which silicon nitride film is formed by thermal CVD or plasma CVD. Further, the second lower interlayer insulating film 20b is a silicon oxide film formed by the thermal CVD or plasma CVD, which has a layer thickness having a range of from 3000 angstroms to 7000 angstroms, more preferably, about 5000 angstroms.

Reference numeral 22 indicates one of through holes, which extends through the lower interlayer insulating film 20. The through hole 22 is defined up to the source/drain region 16a of the PMOS 16 along the silicon substrate 12 through the gate electrode 14c and the source/drain region 14b of the NMOS 14 and via above the isolating oxide film 18.

Reference numeral 24 indicates a local wiring used as a first wiring layer and comprises a high melting-point metal complex film formed by successively laminating a titanium film, a titanium nitride film and a tungsten film as viewed from the silicon substrate 12 side. The local wiring 24 is embedded in the corresponding through hole 22 and connects the gate electrode 14c and the source/drain region 14b of the NMOS 14. Further, the local wiring 24 connects the source/drain region 16a of the PMOS 16 thereto via above the isolating oxide film 18.

Reference numeral 26 indicates an upper interlayer insulating film used as a second insulating film. The upper interlayer insulating film 26 is a silicon oxide film formed by the thermal CVD or plasma CVD, which has a layer thickness having a range of from 3000 angstroms to 7000 angstroms, more preferably, about 5000 angstroms. Reference numerals 28 respectively indicate upper electrode layers each used as a second wiring layer formed on the surface of the upper interlayer insulating film 26 and is formed of a high melting-point metal complex film formed by successively laminating the titanium, titanium nitride film and tungsten film as viewed from the silicon substrate 12 side or an aluminum material film.

Reference numerals 30 respectively indicate contact holes, which comprise through holes 30a defined from the upper interlayer insulating film 26 to the source/drain regions 14a and 16b of the silicon substrate 12, and connecting conductors 30b provided in the through holes 30a. Each of the connecting conductors 30b comprises a high melting-point metal complex film formed by sequentially stacking the titanium film, titanium nitride film and tungsten film on one another from the silicon substrate 12 side.

When the connecting conductors 30b are formed in the same process step as the upper electrode layers 28, they are respectively formed of the high melting-point metal complex film, thus resulting in a complex film formed by successively laminating the titanium film, titanium nitride film and tungsten film on the surface of the silicon substrate 12 and wall surfaces of the through holes 30a.

Each of the contact holes 30 may be formed of a contact plug structure. At this time, the titanium film, titanium nitride film and tungsten film are successively laminated on the surface of the silicon substrate 12 with the through holes 30a interposed therebetween. The excessive high melting-point metal complex film laminated up to the surface of the upper interlayer insulating film 26 is removed by a CMP (Chemical Mechanical Polishing) method. Thereafter, the upper electrode layers 28 are respectively formed of an aluminum material film on the surface of the upper interlayer insulating film 26, and the connecting conductors 30b and the upper electrode layers 28 each formed of the high melting-point complex film embedded in the through holes 30a are connected to one another.

Incidentally, the lower interlayer insulating film 20 and the upper interlayer insulating film 26 are described in FIG. 1 in a see-through form.

A manufacturing method will next be described.

FIGS. 3, 4, 5, 6, 7 and 8 are respectively partly cross-sectional views of the semiconductor integrated circuit 10 shown in respective steps of a process for manufacturing the semiconductor integrated circuit according to the first embodiment.

Figure 3:
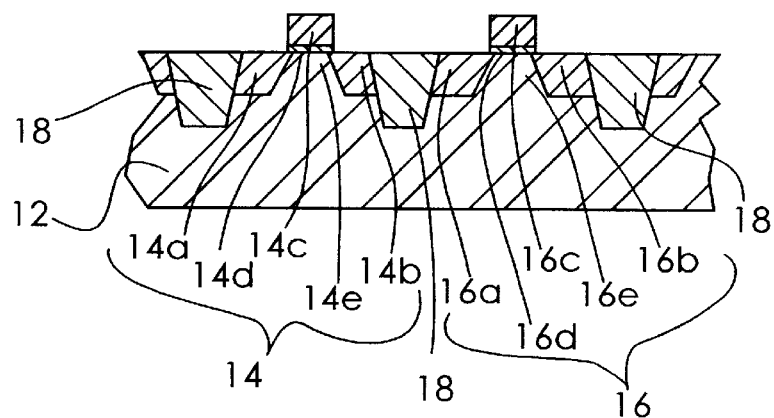
FIG. 3 is a partly cross-sectional view of the semiconductor integrated circuit device according to an embodiment of the present invention shown in a step of a process for manufacturing the semiconductor integrated circuit device.

Referring to FIG. 3, an NMOS 14 and a PMOS 16 are first formed in a p type silicon substrate 12 so as to adjoin each other with isolating oxide films 18 interposed therebetween by the known manufacturing method. The result of such a process step is shown in FIG. 3.

Figure 4:
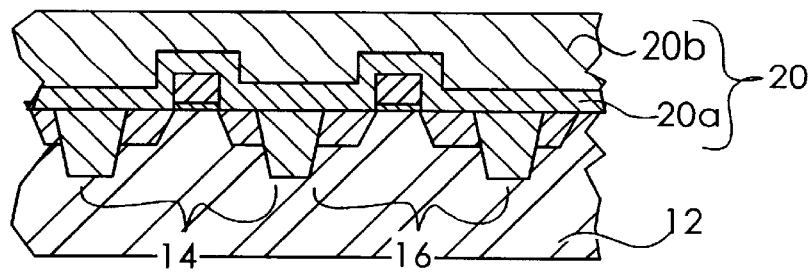
FIG. 4 is a partly cross-sectional view of the semiconductor integrated circuit device according to an embodiment of the present invention shown in a step of a process for manufacturing the semiconductor integrated circuit device.

Referring to FIG. 4, a first lower interlayer insulating film 20a which functions as an etching stopper layer provided on the lower side and a second lower interlayer insulating film 20b on the upper side, are next formed on the silicon substrate 12 with the NMOS 14 and the PMOS 16 interposed therebetween. The result of such a process step is shown in FIG. 4.

Figure 5:
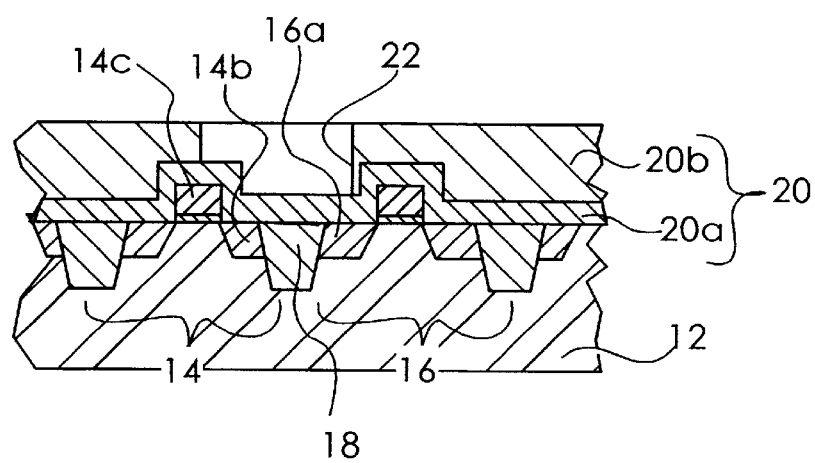
FIG. 5 is a partly cross-sectional view of the semiconductor integrated circuit device according to an embodiment of the present invention shown in a step of a process for manufacturing the semiconductor integrated circuit device.

Referring next to FIG. 5, a through hole 22, which extends from a gate electrode 14c of the NMOS 14 to a source/drain region 16a of the PMOS 16 through a source/drain region 14b and via above the isolating oxide film 18 along the silicon substrate 12, is first defined so as to extend through the second lower interlayer insulating film 20b by photolithography and etching with the first lower interlayer insulating film 20a as an etching stopper layer. The result of such a process step is shown in FIG. 5.

Figure 6:
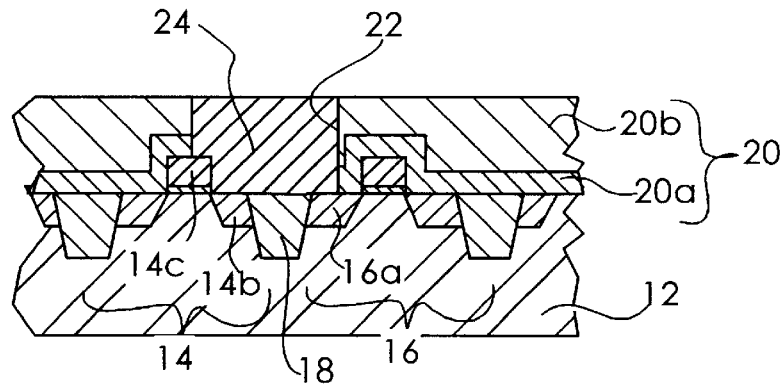
FIG. 6 is a partly cross-sectional view of the semiconductor integrated circuit device according to an embodiment of the present invention shown in a step of a process for manufacturing the semiconductor integrated circuit device.

Referring to FIG. 6, the first lower interlayer insulating film 20a is next removed to expose the surface of the silicon substrate 12, including the source/drain region 14b and the upper portion of the isolating oxide film 18 and the source/drain region 16a, and the surface of the gate electrode 14c. Next, a high melting-point metal complex film formed by successively laminating a titanium film, a titanium nitride film and a tungsten film from the silicon substrate 12 side is formed on the surface of the silicon substrate 12 and the surface of the lower interlayer insulating film 20 via the through hole 22 by thermal CVD or plasma CVD. Thereafter, the excessive high melting-point metal complex film is removed by the CMP method until the surface of the lower interlayer insulating film 20 is exposed. Hence the high melting-point metal complex film is embedded in the corresponding through hole 22. At this stage, a local wiring 24 is formed. The result of such a process step is shown in FIG. 6.

Figure 7:
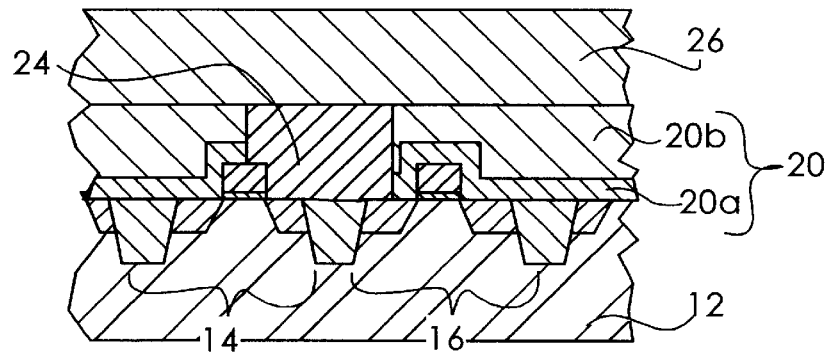
FIG. 7 is a partly cross-sectional view of the semiconductor integrated circuit device according to an embodiment of the present invention shown in a step of a process for manufacturing the semiconductor integrated circuit device.

Referring to FIG. 7, an upper interlayer insulating film 26 is next formed on the surface of the lower interlayer insulating film 20 so as to cover the local wiring 24. The result of such a process step is shown in FIG. 7.

Figure 8:
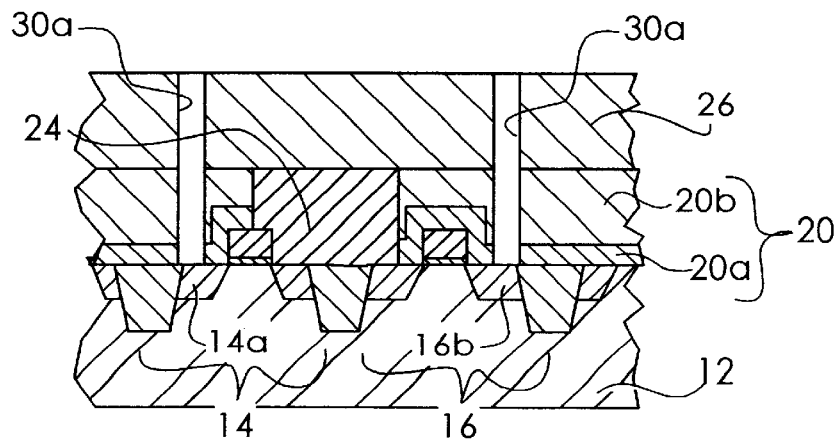
FIG. 8 is a partly cross-sectional view of the semiconductor integrated circuit device according to an embodiment of the present invention shown in a step of a process for manufacturing the semiconductor integrated circuit device.

Referring to FIG. 8, the upper interlayer insulating film 26 is next defined or bored by photolithography and etching until the source/drain regions 14a and 16b of the silicon substrate 12 are exposed from the surface of the upper interlayer insulating film 26 to thereby form through holes 30a of contact holes 30.

In this process step, etching is temporarily stopped with the first lower interlayer insulating film 20a as an etching stopper layer, and the first lower interlayer insulating film 20a may be etched anew. The etching may be performed until the source/drain regions 14a and 16b are exposed at a time. The result of such a process step is shown in FIG. 8.

Next, the titanium film, the titanium nitride film and the tungsten film are successively laminated from above the surface of the upper interlayer insulating film 26 to form a high melting-point metal complex film comprised of the titanium film, the titanium nitride film and the tungsten film on the surfaces of the silicon substrate 12 and the upper interlayer insulating film 26 via the through holes 30a, whereby upper electrode layers 28 and connecting conductors 30b are formed in the same process step by photolithography and etching.

The connecting conductors 30b may take a contact plug structure as described previously. At this time, the upper electrode layers 28 are formed of an aluminum material film on the surface of the upper interlayer insulating film 26 after the high melting-point metal complex film has been embedded in the through holes 30a as the connecting conductors 30b, so that the connecting conductors 30a and the upper electrode layers 28 are connected to each other. The result of such a process step leads to the semiconductor integrated circuit 10 shown in FIGS. 1 and 2.

In the first embodiment as well, the through holes 30a of the contact holes 30 are defined in one process step with respect to the upper interlayer insulating film 26 and the lower interlayer insulating film 20. Even when the connecting conductors 30b take the contact plug structure and are formed in the same process step as the upper electrode layers 28, they are continuous in material and composition in the neighborhood of the boundary between the lower interlayer insulating film 20 and the upper interlayer insulating film 26. Therefore, the semiconductor integrated circuit 10 simple in configuration can be provided at low cost.

In the semiconductor integrated circuit 10 according to the first embodiment, the interlayer insulating films interposed between the NMOS 14 and PMOS 16 and the upper electrode layers 28 comprise two layers corresponding to the lower interlayer insulating film 20 and the upper interlayer insulating film 26. Further, the source/drain region 14b and gate electrode 14c of the NMOS 14, and the source/drain region 16a of the PMOS 16 are connected to one another by means of the local wiring 24 which comprises the high melting-point metal complex film. The high melting-point metal complex film is buried in the through hole 22 of the lower interlayer insulating film 20, and the upper interlayer insulating film 26 is placed on the lower interlayer insulating film 20 so as to cover the local wiring 24. The upper electrode layers 28 are provided on the upper interlayer insulating film 26.

Further, the upper electrode layers 28 respectively connected to another source/drain region 14a of the NMOS 14 and another source/drain region 16b of the PMOS 16 through the contact holes 30 are disposed on the upper interlayer insulating film 26.

The conventional structure needs to provide each upper electrode layer for connecting the source/drain region 14b and gate electrode 14c of the NMOS 14 and the source/drain region 16a of the PMOS 16 on the interlayer insulating film. In terms of the structure of the semiconductor integrated circuit 10, the upper electrode layer is placed between the respective upper electrode layers connected to the source/drain region 14a of the NMOS 14 and the source/drain region 16b of the PMOS 16 through the contact holes 30. Therefore, the wiring-layer interval between the upper electrode layers becomes narrow, and an etching gas for dry etching becomes hard to deeply enter a wiring space upon etching for forming each wiring layer, thus resulting in a metal residual of a wiring material.

However, in the semiconductor integrated circuit 10 according to the first embodiment, the local wiring 24 for connecting the source/drain region 14b and gate electrode 14c of the NMOS 14 and the source/drain region 16a of the PMOS 16 is buried in the corresponding through hole 22 of the lower interlayer insulating film 20, and the upper interlayer insulating film 26 is disposed on the lower interlayer insulating film 20 so as to cover the local wiring 24.

Therefore, since the local wiring 24 is covered with the upper interlayer insulating film 26 even if the local wiring 24 is placed between the respective contact holes 30 connected to the source/drain region 14a of the NMOS 14 and the source/drain region 16b of the PMOS 16 in view of the structure of the semiconductor integrated circuit 10, the interval between the respective adjacent upper electrode layers 28 connected to the source/drain region 14a of the NMOS 14 and the source/drain region 16b of the PMOS 16 through the contact holes 30 becomes wide sufficiently as compared with the conventional structure. Thus, since the etching gas for dry etching is fully supplied to each wiring space upon pattern formation of the upper electrode layers 28, the etching is carried out without a hitch, and the metal residual of the wiring material is no longer left behind.

In other words, it is possible to relax a wiring pitch of each upper electrode layer 28 and prevent a yield reduction due to the failure of formation of the upper electrode layers 28. An inexpensive and high-reliable semiconductor integrated circuit device can be configured in its turn. According to the manufacturing method described in the first embodiment, a semiconductor integrated circuit high in reliability and yield can be manufactured in a simple process. It is therefore possible to provide a high-reliable and yield-improved semiconductor integrated circuit at low cost.

Second Embodiment

Figure 9:
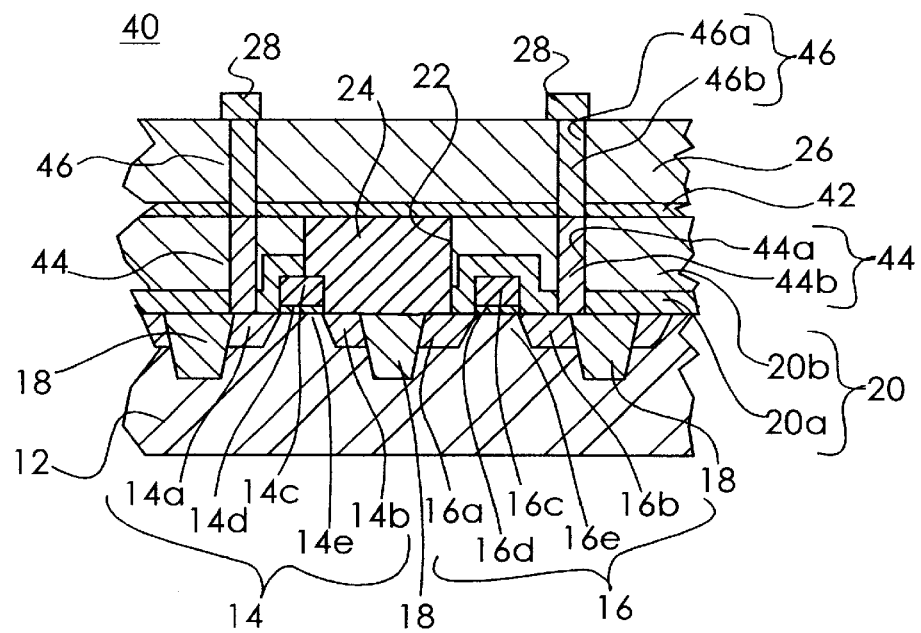
FIG. 9 is a partly cross-sectional view of an integrated circuit device according to an embodiment of the present invention.

FIG. 9 is a partly cross-sectional view of an integrated circuit device according to a second embodiment. A plan view of the integrated circuit device is identical to the partly see-through plan view of FIG. 1, and a sectional position corresponding to FIG. 3 is also equivalent to a section taken along line II—II of FIG. 1.

In FIG. 9, reference numeral 40 indicates a semiconductor integrated circuit, e.g., an SRAM, in the present embodiment, a partial CMOS thereof. Reference numeral 42 indicates an etching stopper layer used as a third insulating film, which is provided so as to be interposed between an upper interlayer insulating film 26 and a lower interlayer insulating film 20. The etching stopper layer 42 is a silicon nitride film whose layer thickness ranges from 200 angstroms to 500 angstroms and which has the function of stopping etching upon etching of the upper interlayer insulating film 26.

Reference numerals 44 indicate lower contact holes each used as a first contact hole and respectively comprise lower through holes 44a which extend through the lower interlayer insulating film 20, and lower connecting conductors 44b placed in the lower through holes 44a. Each of the lower connecting conductors 44b comprises a high melting-point metal complex film formed by successively laminating a titanium film, a titanium nitride film and a tungsten film from the silicon substrate 12 side. Each lower contact hole 44 takes a contact plug structure.

Reference numerals 46 indicate upper contact holes each used as a second contact hole and respectively comprise upper through holes 46a which extend through the upper interlayer insulating film 26 and the etching stopper layer 42, and upper connecting conductors 46b placed in the upper through holes 46a. Since each of the upper through holes 46a simply extends through the upper interlayer insulating film 26 and the etching stopper layer 42, the depth thereof is relatively shallow. Therefore, the aspect ratio of each upper through hole 46a becomes small and is easy to open. Each of the upper connecting conductors 46b is formed of the high melting-point metal complex film formed by successively laminating the titanium film, titanium nitride film and tungsten film, or an aluminum material film in the same process step as each upper electrode layer 28. Of course, the upper contact hole 46 may be constructed of the contact plug structure.

A manufacturing method will next be described.

FIGS. 10, 11, 12, 13 and 14 are respectively partly cross-sectional views of the semiconductor integrated circuit 40 shown in respective steps of a manufacturing process.

The formation of an NMOS 14 and a PMOS 16 in the silicon substrate 12 and the formation of a lower interlayer insulating film 20 thereon are identical to those employed in the first embodiment, and hence they are carried out as described in FIGS. 3 and 4 in the first embodiment.

Figure 10:
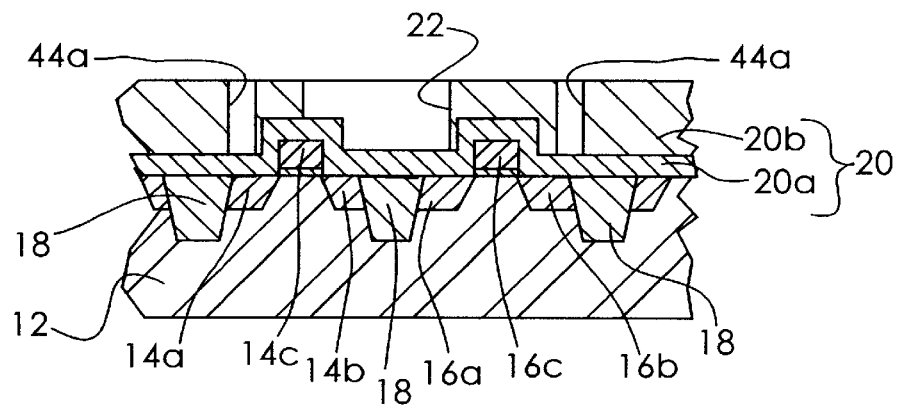
FIG. 10 is a partly cross-sectional view of the semiconductor integrated circuit device according to an embodiment of the present invention shown in a step of a process for manufacturing the semiconductor integrated circuit device.

Referring next to FIG. 10, a through hole 22, which extends along a silicon substrate 12 from a gate electrode 14c of an NMOS 14 to a source/drain region 16a of a PMOS 16 through a source/drain region 14b and via above an isolating oxide film 18, and lower through holes 44a provided on a source/drain region 14a and a source/drain region 16b are defined so as to extend through a second lower interlayer insulating film 20b by photolithography and etching with a first lower interlayer insulating film 20a as an etching stopper layer. The result of such a process step is shown in FIG. 10.

Figure 11:
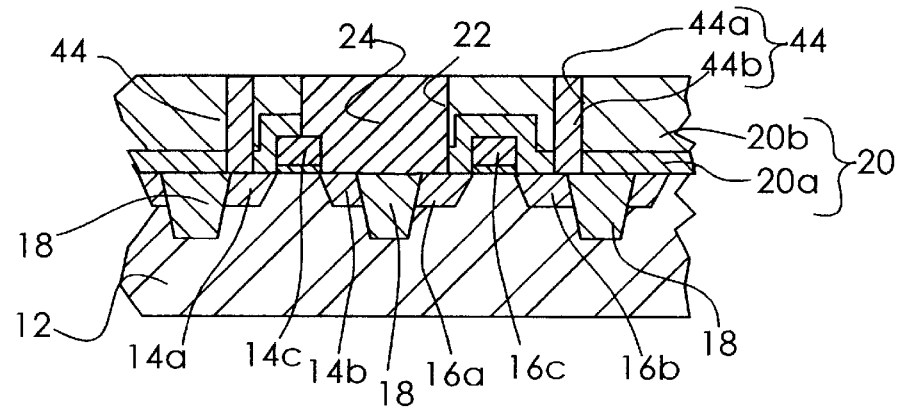
FIG. 11 is a partly cross-sectional view of the semiconductor integrated circuit device according to an embodiment of the present invention shown in a step of a process for manufacturing the semiconductor integrated circuit device.

Referring to FIG. 11, the first lower interlayer insulating film 20a is next removed to expose the surface of the silicon substrate 12, including the source/drain region 14b, an upper portion of the isolating oxide film 18 and the source/drain region 16a, the surface of the gate electrode 14c, and the surfaces of the source/drain region 14a and the source/drain region 16b.

Next, a high melting-point metal complex film formed by successively laminating a titanium film, a titanium nitride film and a tungsten film from the silicon substrate 12 side is formed on the surface of the silicon substrate 12 and the surface of the lower interlayer insulating film 20 through the through hole 22 and the lower through holes 44a by thermal CVD or plasma CVD.

Afterwards, the excessive high melting-point metal complex film is removed by a CMP method until the surface of the lower interlayer insulating film 20 is exposed. Hence the high melting-point metal complex film is embedded in the through hole 22 and the lower through holes 44a. At this stage, a local wiring 24 and lower connecting conductors 44b are formed. The result of such a process step is shown in FIG. 11.

Figure 12:
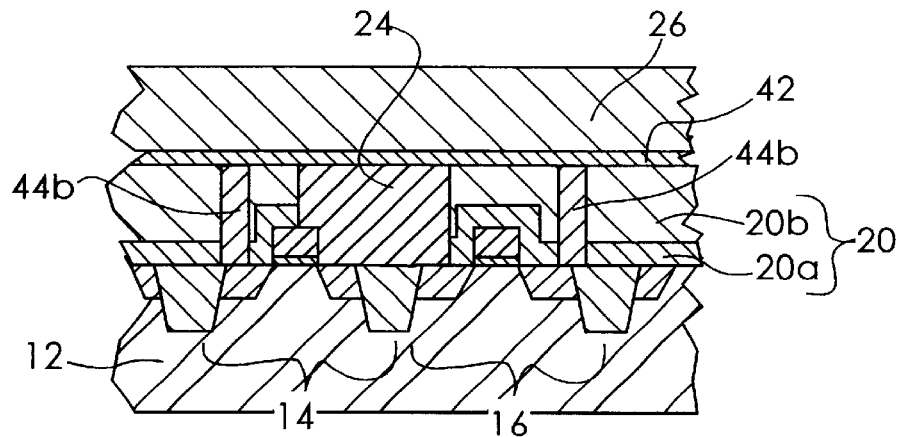
FIG. 12 is a partly cross-sectional view of the semiconductor integrated circuit device according to an embodiment of the present invention shown in a step of a process for manufacturing the semiconductor integrated circuit device.

Referring to FIG. 12, an etching stopper layer 42 and an upper interlayer insulating film 26 are next successively formed on the surface of the lower interlayer insulating film 20 so as to cover the local wiring 24 and the lower connecting conductors 44b. The result of such a process step is shown in FIG. 12.

Figure 13:
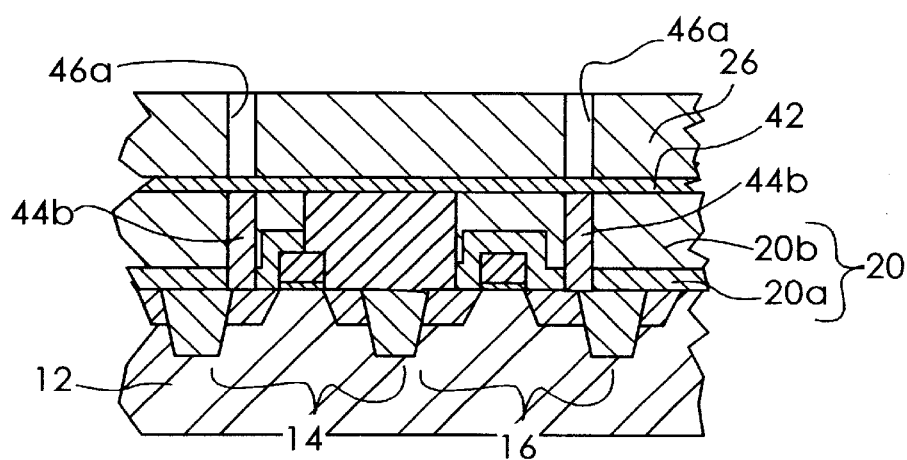
FIG. 13 is a partly cross-sectional view of the semiconductor integrated circuit device according to an embodiment of the present invention shown in a step of a process for manufacturing the semiconductor integrated circuit device.

Referring to FIG. 13, the upper interlayer insulating film 26 is bored immediately above the lower connecting conductors 44b from the surface thereof until etching stops at the etching stopper layer 42 to thereby form or define upper through holes 46a extending through the upper interlayer insulating film 26. The result of such a process step is shown in FIG. 13.

Figure 14:
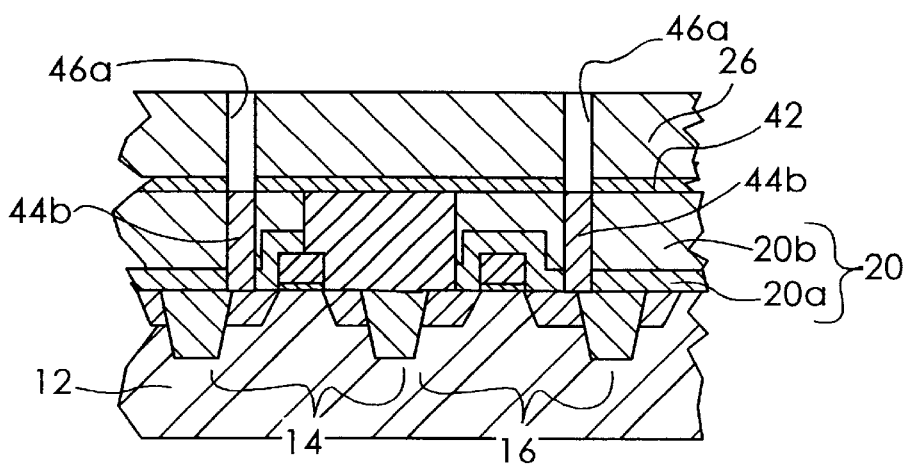
FIG. 14 is a partly cross-sectional view of the semiconductor integrated circuit device according to an embodiment of the present invention shown in a step of a process for manufacturing the semiconductor integrated circuit device.

Referring to FIG. 14, the etching stopper layers 42 exposed by the upper through holes 46a are removed to expose the lower connecting conductors 44b. The result of such a process step is shown in FIG. 14.

Next, the titanium film, the titanium nitride film and the tungsten film are successively laminated from the surface of the upper interlayer insulating film 26. Further, the high melting-point metal complex film formed of the titanium film, titanium nitride film and tungsten film is formed on the surfaces of the lower connecting conductors 44b and the upper interlayer insulating film 26 through the through holes 46a. Upper electrode layers 28 and upper connecting conductors 46b are formed in the same process step by photolithography and etching. The result of such a process step leads to the semiconductor integrated circuit 40 shown in FIG. 9.

The upper electrode layers 28 and the upper connecting conductors 46b may be formed in the same process step by the use of an aluminum material film.

While the semiconductor integrated circuit 40 according to the second embodiment is substantially identical to the semiconductor integrated circuit 10 according to the first embodiment in configuration, the contact holes corresponding to two layers of the lower contact holes 44 provided in the lower interlayer insulating film 20, and the upper contact holes 46 provided in the upper interlayer insulating film 26 and the etching stopper layer 42 are provided as an alternative to the contact holes 30 of the semiconductor integrated circuit 10.

Since the depth of the lower through hole 44a of each lower contact hole 44 becomes shallow in the semiconductor integrated circuit 40 owing to the above, etching control becomes easy as compared with the formation of the through holes 30a of the contact holes 30 in the semiconductor integrated circuit 10. Accordingly, the source/drain regions 14a and 16b little suffer damage resulting from plasma exercised upon the etching for defining the through holes of the contact holes, and current leaks in the source/drain regions 14a and 16b decrease, thus improving device characteristics.

In the semiconductor integrated circuit 40, the lower through holes 44a of the lower contact holes 44 and the upper through holes 46a of the upper contact holes 46 are both easy to open under etching due to a decrease in aspect ratio. Thus, the lower contact holes 44 and the upper contact holes 46 can reliably be formed. In its turn, the yield of the semiconductor integrated circuit 40 is improved.

Third Embodiment

Figure 15:
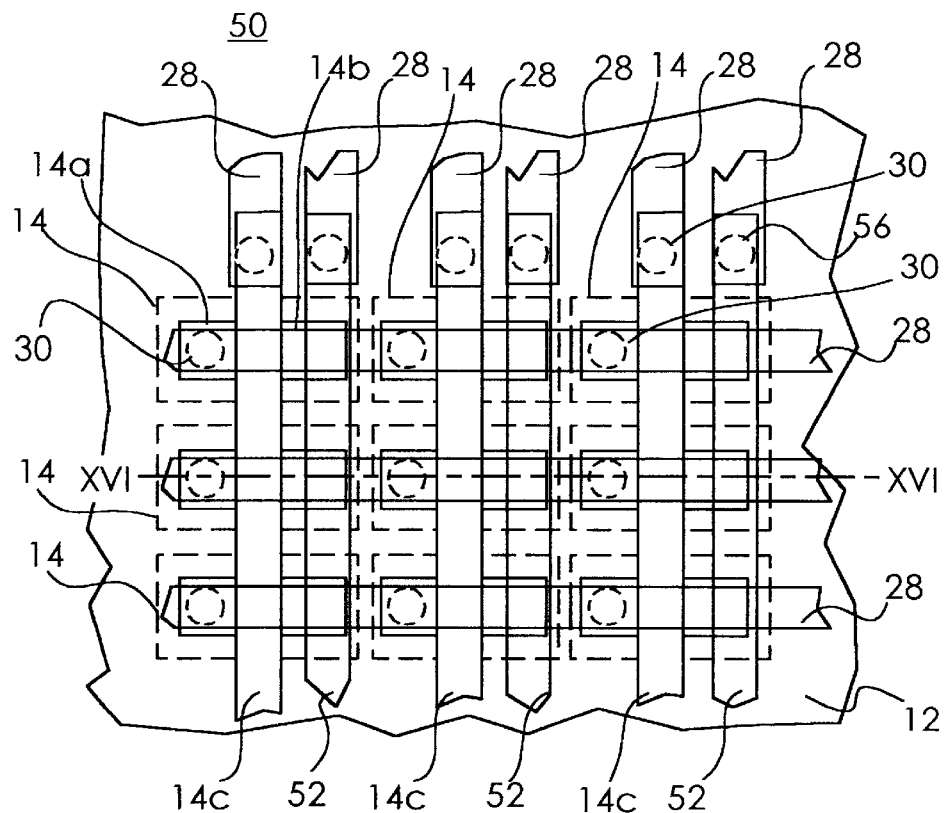
FIG. 15 is a partly see-through plan view of an integrated circuit device according to an embodiment of the present invention.
Figure 16:
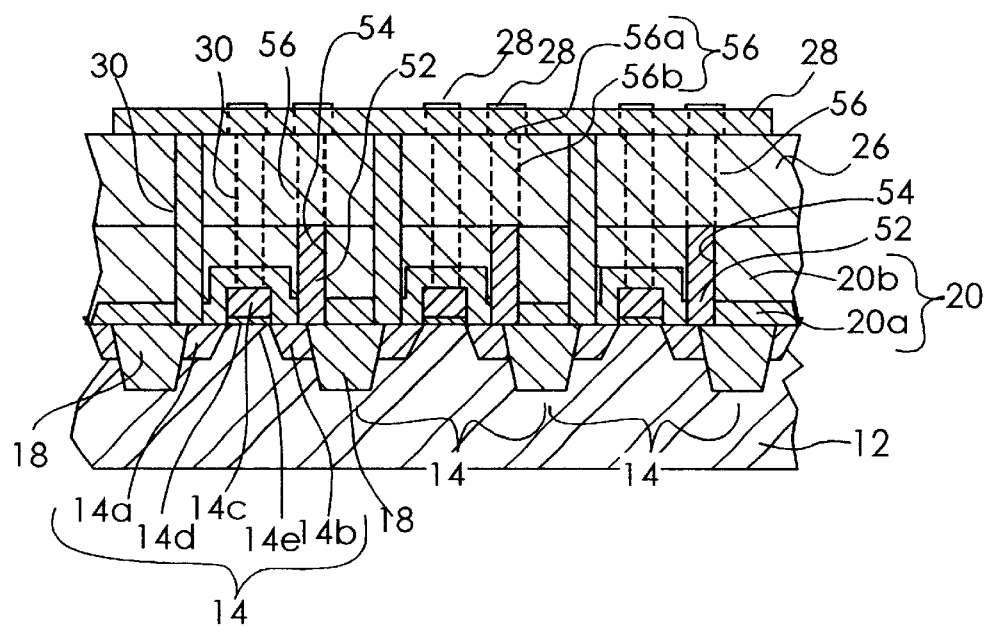
FIG. 16 is a cross-sectional view of the integrated circuit device according to an embodiment of the present invention as viewed from a section taken along line XVI-XVI of FIG. 15.

FIG. 15 is a partly see-through plan view of an integrated circuit device according to a third embodiment. FIG. 16 is a cross-sectional view of the integrated circuit device according to the third embodiment as viewed from a section taken along line XVI—XVI of FIG. 15.

In FIGS. 15 and 16, reference numeral 50 indicates a semiconductor integrated circuit, e.g., Flash (non-volatile memory). An arrangement of parts of NMOSs defined as first and second semiconductor elements is shown herein. Reference numerals 52 indicate local wirings each used as a first wiring layer, each of which is a common wiring for holding, for example, ones of source/drain regions of respective elements, e.g., source/drain regions 14b at the same potential. The local wirings 52 are embedded in their corresponding through holes 54 placed in a lower interlayer insulating film 20 in parallel with gate electrodes 14c. Further, the local wirings 52 respectively comprise a high melting-point metal complex film formed by successively laminating a titanium film, a titanium nitride film and a tungsten film from the silicon substrate 12 side.

Reference numerals 30 indicate contact holes. In the semiconductor integrated circuit 50, each of the contact holes comprises a through hole 30a defined from the surface of an upper interlayer insulating film 26 to a source/drain region 14a of the silicon substrate 12 or from the surface of the upper interlayer insulating film 26 to the surface of one end of the gate electrode 14c, and a connecting conductor 30b placed in the corresponding through hole 30a.

Reference numerals 56 indicate contact holes, each of which comprises a through hole 56a defined from the surface of the upper interlayer insulating film 26 to the surface of one end of the local wiring 52, and a connecting conductor 56b placed in the through hole 56a. The connecting conductor 56b is formed of the high melting-point metal complex film formed by successively laminating the titanium film, titanium nitride film and tungsten film from the silicon substrate 12 side, or an aluminum material film.

The contact holes 30 and the contact holes 56 may respectively be formed of a contact plug structure. At this time, the titanium film, the titanium nitride film and the tungsten film are successively laminated on the surface of the silicon substrate 12, the surfaces of the gate electrodes 14c, and the surfaces of the local wirings 52 through the through holes 30a and the through holes 56a. Further, the excessive high melting-point metal complex film laminated up to the surface of the upper interlayer insulating film 26 is removed by a CMP (Chemical Mechanical Polishing) method. Thereafter, upper electrode layers 28 are formed on the surface of the upper interlayer insulating film 26 with the aluminum material film. Thus, the connecting conductors 30b and connecting conductors 56b formed of the high melting-point metal complex film buried in the through holes 30a and the through holes 56a, and the upper electrode layers 28 are respectively connected.

Incidentally, the lower interlayer insulating film 20 and the upper interlayer insulating film 26 are shown in a see-through form in FIG. 15.

FIGS. 17, 18, 19, 20, 21 and 22 are respectively partly cross-sectional views of the semiconductor integrated circuit 50 shown in respective steps of a manufacturing process.

Figure 17:
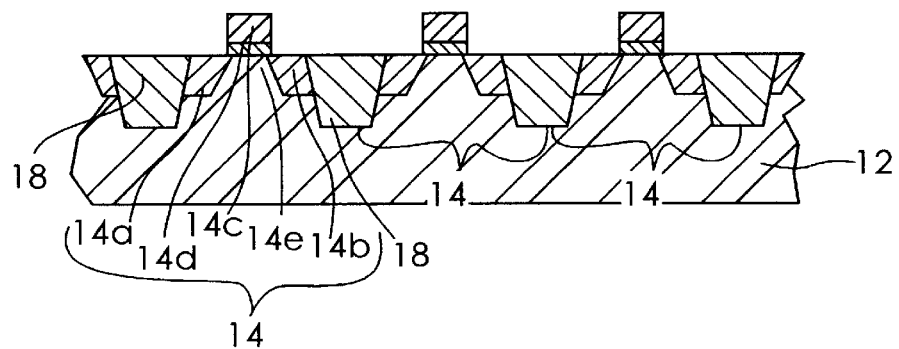
FIG. 17 is a partly cross-sectional view of the semiconductor integrated circuit device according to an embodiment of the present invention shown in a step of a process for manufacturing the semiconductor integrated circuit device.

Referring to FIG. 17, NMOSs 14 are first formed in a p-type silicon substrate 12 so as to adjoin each other with isolating oxide films 18 respectively interposed therebetween, by the known manufacturing method. The result of such a process step is shown in FIG. 17.

Figure 18:
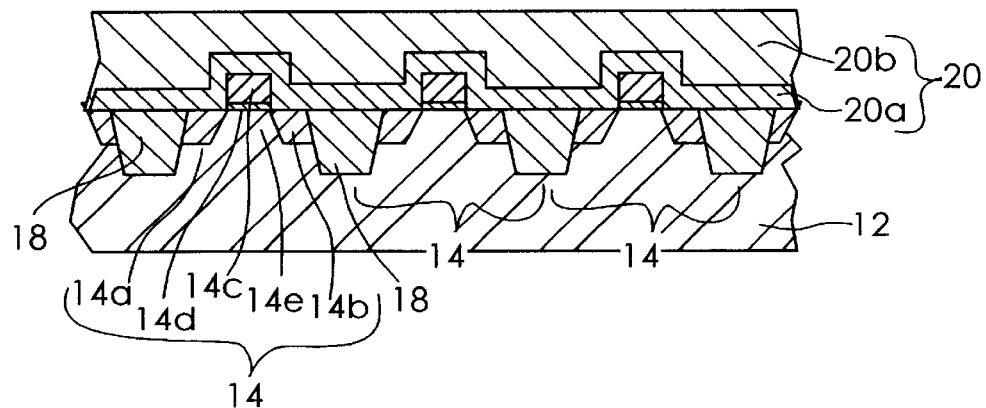
FIG. 18 is a partly cross-sectional view of the semiconductor integrated circuit device according to an embodiment of the present invention shown in a step of a process for manufacturing the semiconductor integrated circuit device.

Referring to FIG. 18, a first lower interlayer insulating film 20a, which functions as an etching stopper layer, on the lower side and a second lower interlayer insulating film 20b on the upper side are next formed on the silicon substrate 12 with each NMOS 14 interposed therebetween. The result of such a process step is shown in FIG. 18.

Figure 19:
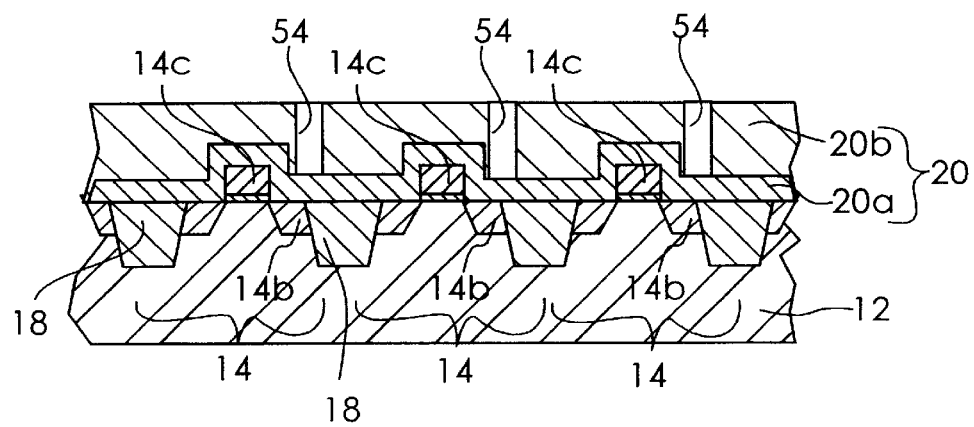
FIG. 19 is a partly cross-sectional view of the semiconductor integrated circuit device according to an embodiment of the present invention shown in a step of a process for manufacturing the semiconductor integrated circuit device.

Referring next to FIG. 19, through holes 54, each of which extends in parallel with a gate electrode 14c of each NMOS 14 via one source/drain region 14b of each NMOS 14, are first defined so as to extend through the second lower interlayer insulating film 20b with the first lower interlayer insulating film 20a as the etching stopper layer by using photolithography and etching. The result of such a process step is shown in FIG. 19.

Figure 20:
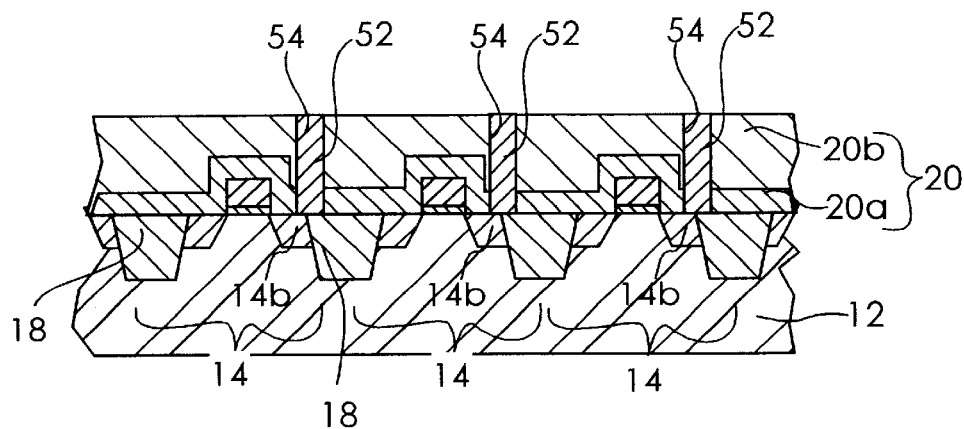
FIG. 20 is a partly cross-sectional view of the semiconductor integrated circuit device according to an embodiment of the present invention shown in a step of a process for manufacturing the semiconductor integrated circuit device.

Referring to FIG. 20, the first lower interlayer insulating film 20a is next removed to expose the surface of each source/drain region 14b. Then, a high melting-point metal complex film formed by successively laminating a titanium film, a titanium nitride film and a tungsten film from the silicon substrate 12 side is formed on the surface of the silicon substrate 12 and the surface of the lower interlayer insulating film 20 via the through holes 54 by thermal CVD or plasma CVD. Afterwards, the excessive high melting-point metal complex film is removed by a CMP method until the surface of the lower interlayer insulating film 20 is exposed. Hence the high melting-point metal complex film is embedded in each through hole 54. At this stage, local wirings 52 are formed. The result of such a process step is shown in FIG. 20.

Figure 21:
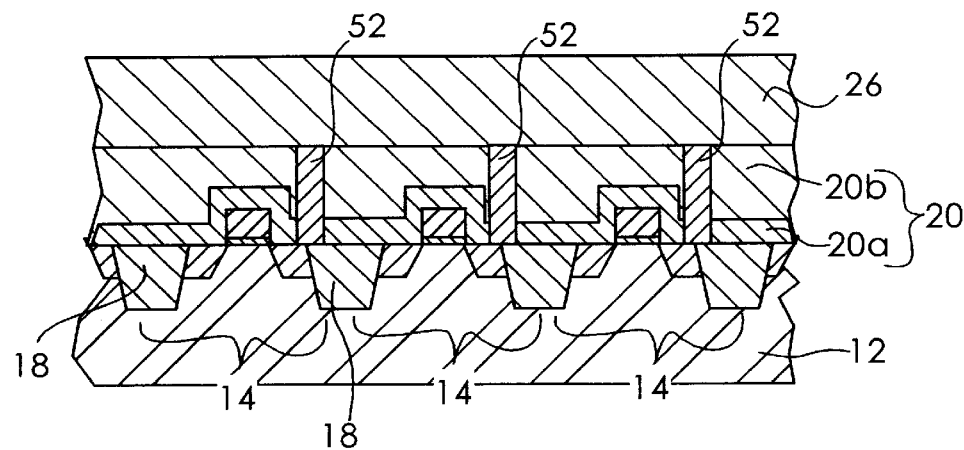
FIG. 21 is a partly cross-sectional view of the semiconductor integrated circuit device according to an embodiment of the present invention shown in a step of a process for manufacturing the semiconductor integrated circuit device.

Referring to FIG. 21, an upper interlayer insulating film 26 is next formed on the surface of the lower interlayer insulating film 20 so as to cover the local wirings 52. The result of such a process step is shown in FIG. 21.

Figure 22:
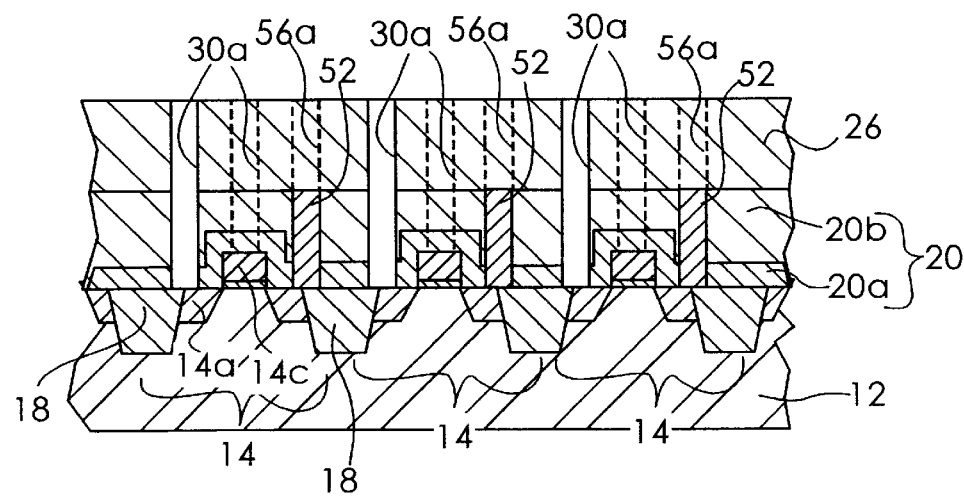
FIG. 22 is a partly cross-sectional view of the semiconductor integrated circuit device according to an embodiment of the present invention shown in a step of a process for manufacturing the semiconductor integrated circuit device.

Referring to FIG. 22, up to the source/drain regions 14a of the silicon substrate 12 from the surface of the upper interlayer insulating film 26 and up to the surfaces of one ends of the gate electrodes 14c from the surface of the upper interlayer insulating film 26, and up to the surfaces of one ends of the local wirings 52 from the surface of the upper interlayer insulating film 26 are next respectively bored by photolithography and etching to thereby define or form through holes 30a and through holes 56a. The result of such a process step is shown in FIG. 22.

Next, the titanium film, the titanium nitride film and the tungsten film are successively stacked on one another from the surface of the upper interlayer insulating film 26. Thus, the high melting-point metal complex film formed of the titanium film, titanium nitride film and tungsten film is formed on the surfaces of the silicon substrate 12 and the upper interlayer insulating film 26 through the through holes 30a, and the surfaces of the local wirings 52 via the through holes 56a. Thereafter, upper electrode layers 28, and connecting conductors 30b and connecting conductors 56b are formed in the same process step by photolithography and etching.

Each of the connecting conductors 30b and the connecting conductors 56b may be formed of a contact plug structure as described previously. At this time, the high melting-point metal complex film is embedded in the through holes 30a as the connecting conductors 30b and in the through holes 56a as the connecting conductors 56b. Afterwards, the upper electrode layers 28 are formed on the surface of the upper interlayer insulating film 26 with an aluminum material film, whereby the connecting conductors 30b and connecting conductors 56b, and the upper electrode layers 28 are connected to one another. The result of this process step leads to the semiconductor integrated circuit 50 shown in FIGS. 15 and 16.

In the case of the conventional structure, since one source/drain regions 14b of the respective NMOSs 14 are connected by means of the impurity diffusion regions to make such source/drain regions 14 equal to one another in potential, elemental devices are disposed in high density. When the width of each active region becomes narrow, a resistance value increases suddenly, thus resulting in degradation of device characteristics.

In the semiconductor integrated circuit 50 according to the third embodiment, however, the source/drain regions 14b of the respective NMOSs 14 are connected to each other by the local wirings 52 comprising the high melting-point metal complex film. According to the semiconductor integrated circuit 50, for example, since the local wirings 52 formed of the high melting-point metal film are used as the common source lines, the source resistance of the semiconductor integrated circuit 50 can be held low. It is also possible to prevent degradation in device characteristic, such as a reduction in the speed due to an increase in time constant and a decrease in drive current of each transistor.

Thus, a semiconductor integrated circuit can be configured which is high in reliability and improved in yield. According to the manufacturing method described in the third embodiment, since a semiconductor integrated circuit high in reliability and yield can be fabricated in a simple process, a high-reliable and yield-improved semiconductor integrated circuit can be provided at a low price.

Fourth Embodiment

Figure 23:
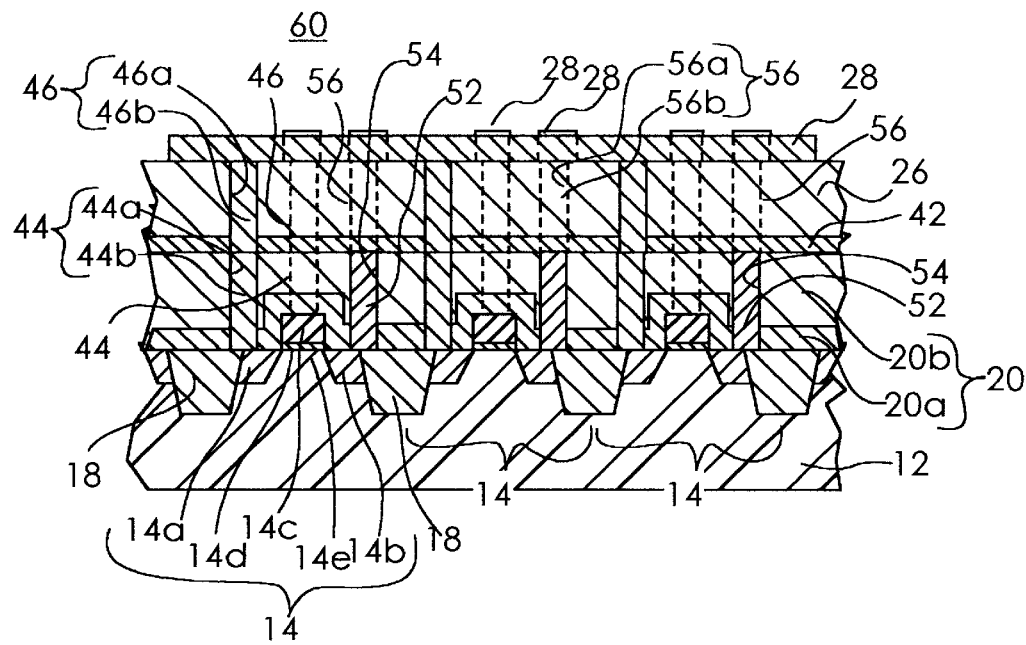
FIG. 23 is a partly see-through plan view of an integrated circuit device according to an embodiment of the present invention.

FIG. 23 is a cross-sectional view of an integrated circuit device according to a fourth embodiment. A plan view of the integrated circuit device is identical to the partly see-through plan view of FIG. 15. A sectional position corresponding to FIG. 23 also corresponds to a section taken along line XVI—XVI of FIG. 15.

In FIG. 23, reference numeral 60 indicates a semiconductor integrated circuit, for example, a DRAM, in the present embodiment, a partial NMOS thereof. Reference numeral 42 indicates an etching stopper layer used as a third insulating film, which is similar to the etching stopper layer 42 employed in the second embodiment in configuration.

Further, lower contact holes 44 and upper contact holes 46 are similar to those employed in the second embodiment in configuration.

The semiconductor integrated circuit 60 is substantially identical to the semiconductor integrated circuit 50 according to the third embodiment but different therefrom in that the etching stopper layer 42 is used and the contact holes relative to source/drain regions 14a and gate electrodes 14c are respectively configured in the form of two layers.

A manufacturing method will next be explained.

FIGS. 24, 25, 26, 27, 28 and 29 are respectively partly cross-sectional views of the semiconductor integrated circuit 60 shown in respective steps of a manufacturing process.

The formation of each NMOS 14 on the a silicon substrate 12 and the formation of a lower interlayer insulating film 20 thereon are identical to those employed in the third embodiment and are carried out as described in FIGS. 17 and 18 in the third embodiment.

Figure 24:
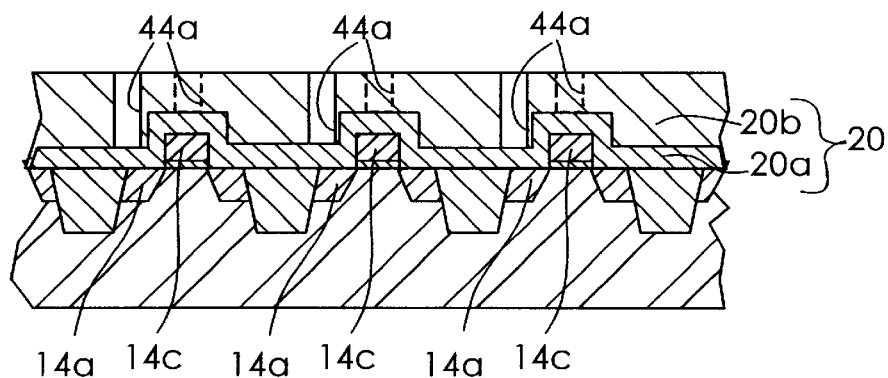
FIG. 24 is a partly cross-sectional view of the semiconductor integrated circuit device according to an embodiment of the present invention shown in a step of a process for manufacturing the semiconductor integrated circuit device.

Referring next to FIG. 24, lower through holes 44a are respectively defined on the surfaces of source/drain regions 14a and one ends of gate electrodes 14c so as to extend through a second lower interlayer insulating film 20b with a first lower interlayer insulating film 20a as an etching stopper layer by photolithography and etching. The result of such a process step is shown in FIG. 24.

Figure 25:
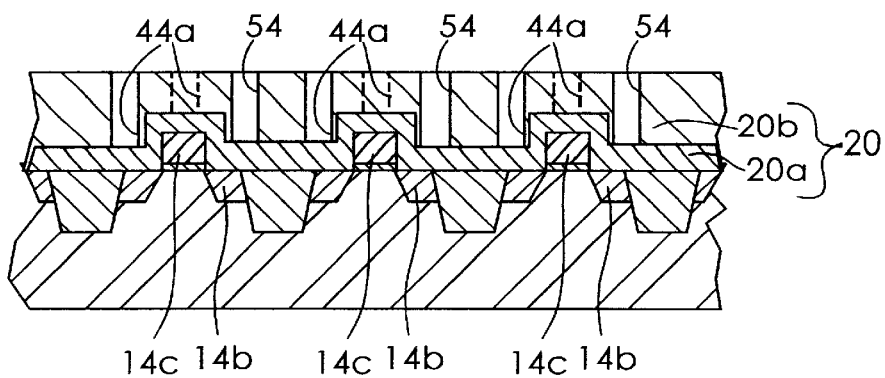
FIG. 25 is a partly cross-sectional view of the semiconductor integrated circuit device according to an embodiment of the present invention shown in a step of a process for manufacturing the semiconductor integrated circuit device.

Referring next to FIG. 25, through holes 54, which extend via one source/drain regions 14b of respective NMOSs 14 in parallel with the gage electrodes 14c of the NMOSs 14, are first defined so as to extend through the second lower interlayer insulating film 20b with the first lower interlayer insulating film 20a as the etching stopper layer by photolithography and etching. The result of this process step is shown in FIG. 25.

Figure 26:
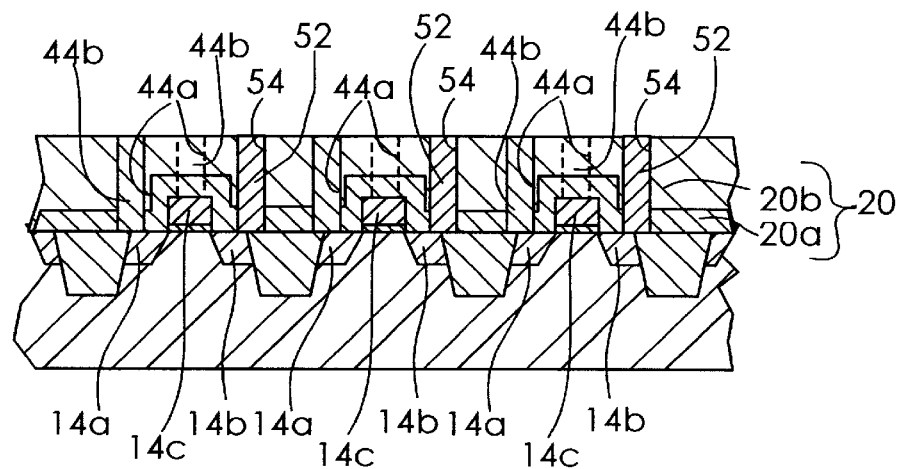
FIG. 26 is a partly cross-sectional view of the semiconductor integrated circuit device according to an embodiment of the present invention shown in a step of a process for manufacturing the semiconductor integrated circuit device.

Referring to FIG. 26, the first lower interlayer insulating film 20a is next removed to expose the surfaces on the silicon substrate 12, of the source/drain regions 14a and 14b and the surfaces of the gate electrodes 14c.

Next, a high melting-point metal complex film formed by successively laminating a titanium film, a titanium nitride film and a tungsten film from the silicon substrate 12 side is formed on the surfaces of the gate electrodes 14c, the surface of the silicon substrate 12 and the surface of the lower interlayer insulating film 20 via the through holes 54 and the lower through holes 44a by thermal CVD or plasma CVD.

Afterwards, the excessive high melting-point metal complex film is removed by a CMP method until the surface of the lower interlayer insulating film 20 is exposed. Thus, the high melting-point metal complex film is buried in the through holes 54 and the lower through holes 44a. At this stage, local wirings 52 and lower connecting conductors 44b are formed. The result of such a process step is shown in FIG. 26.

Figure 27:
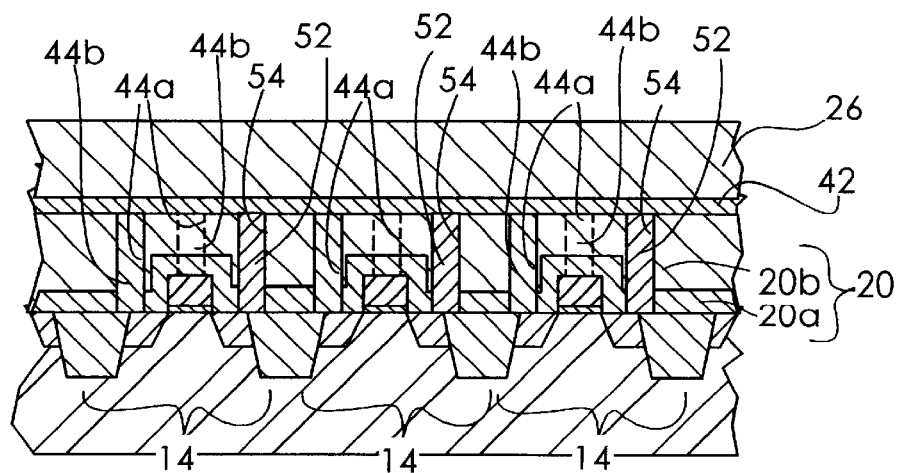
FIG. 27 is a partly cross-sectional view of the semiconductor integrated circuit device according to an embodiment of the present invention shown in a step of a process for manufacturing the semiconductor integrated circuit device.

Referring to FIG. 27, an etching stopper layer 42 and an upper interlayer insulating film 26 are next successively formed on the surface of the lower interlayer insulating film 20 so as to cover the local wirings 52 and the lower connecting conductors 44b. The result of such a process step is shown in FIG. 27.

Figure 28:
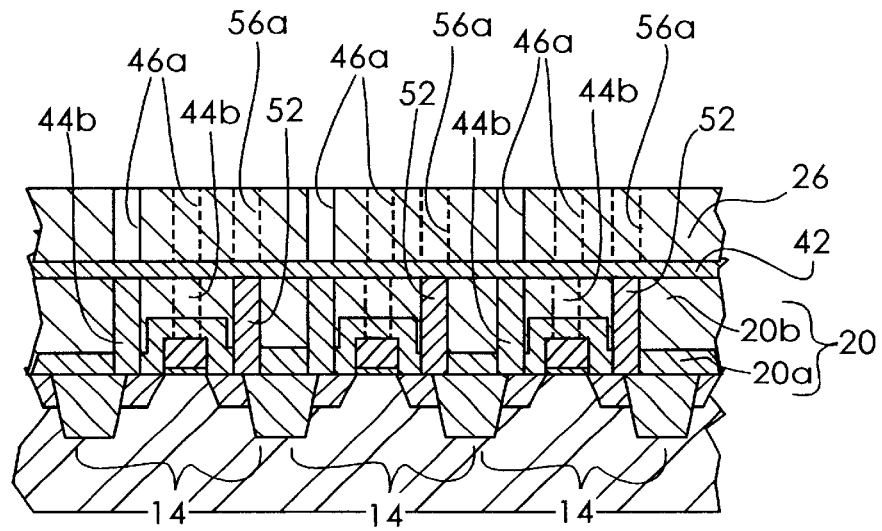
FIG. 28 is a partly cross-sectional view of the semiconductor integrated circuit device according to an embodiment of the present invention shown in a step of a process for manufacturing the semiconductor integrated circuit device.

Referring to FIG. 28, the upper interlayer insulating film 26 is next bored immediately above the lower connecting conductors 44b and the local wirings 52 from the surface thereof by photolithography and etching until etching stops at the etching stopper layer 42, thereby forming or defining upper through holes 46a and through holes 56a extending through the upper interlayer insulating film 26. The result of such a process step is shown in FIG. 28.

Figure 29:
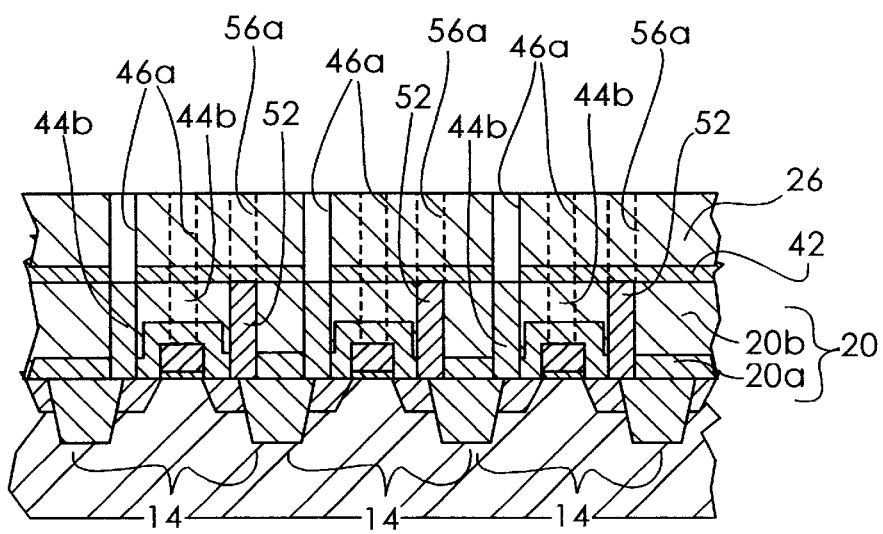
FIG. 29 is a partly cross-sectional view of the semiconductor integrated circuit device according to an embodiment of the present invention shown in a step of a process for manufacturing the semiconductor integrated circuit device.
Figure 30:
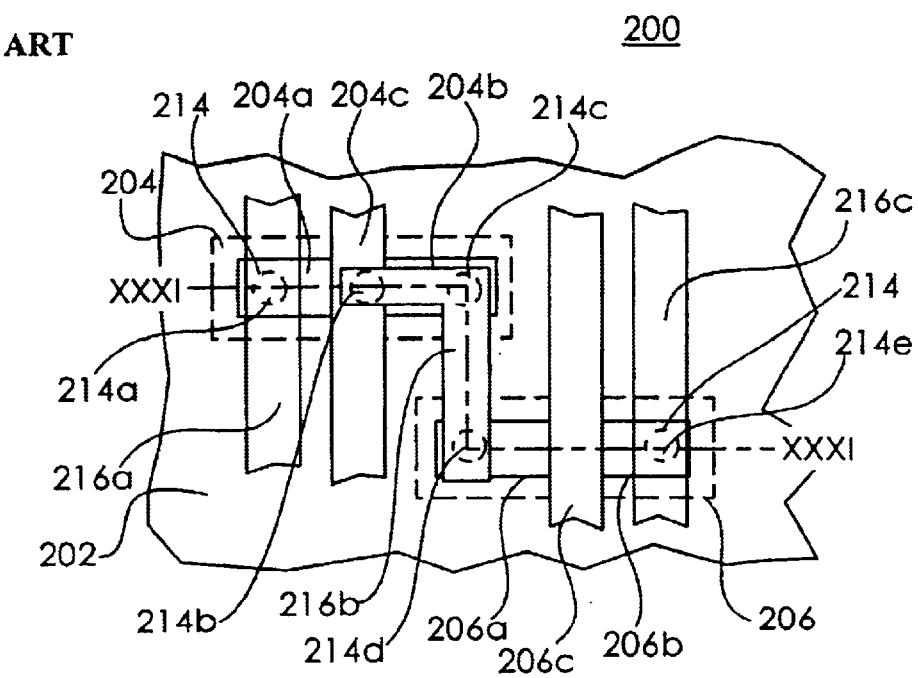
FIG. 30 is a partly see-through plan view of a convention integrated circuit device.
Figure 31:
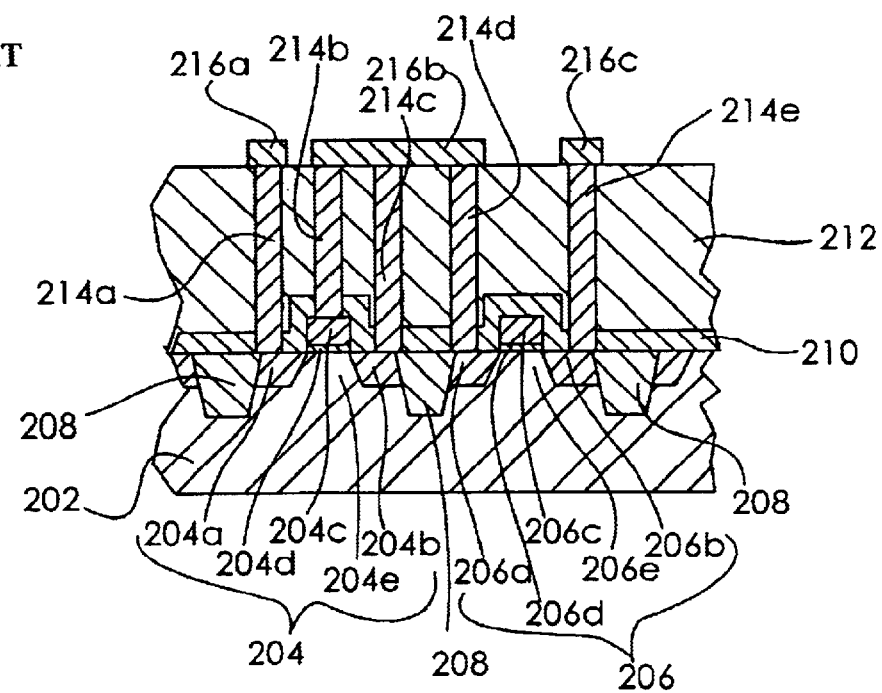
FIG. 31 is a cross-section view of the conventional integrated circuit device as viewed in the form of a section taken along line XXXI—XXXI of FIG. 30.
Figure 32:
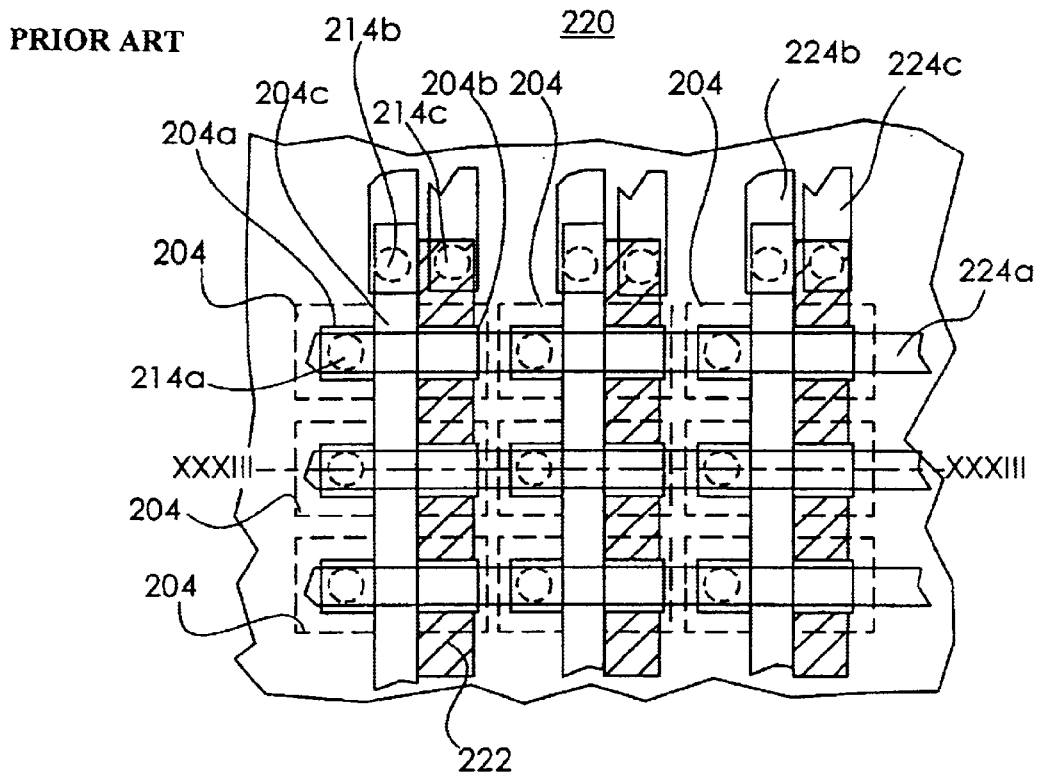
FIG. 32 is a partly see-through plan view of another conventional integrated circuit device.
Figure 33:
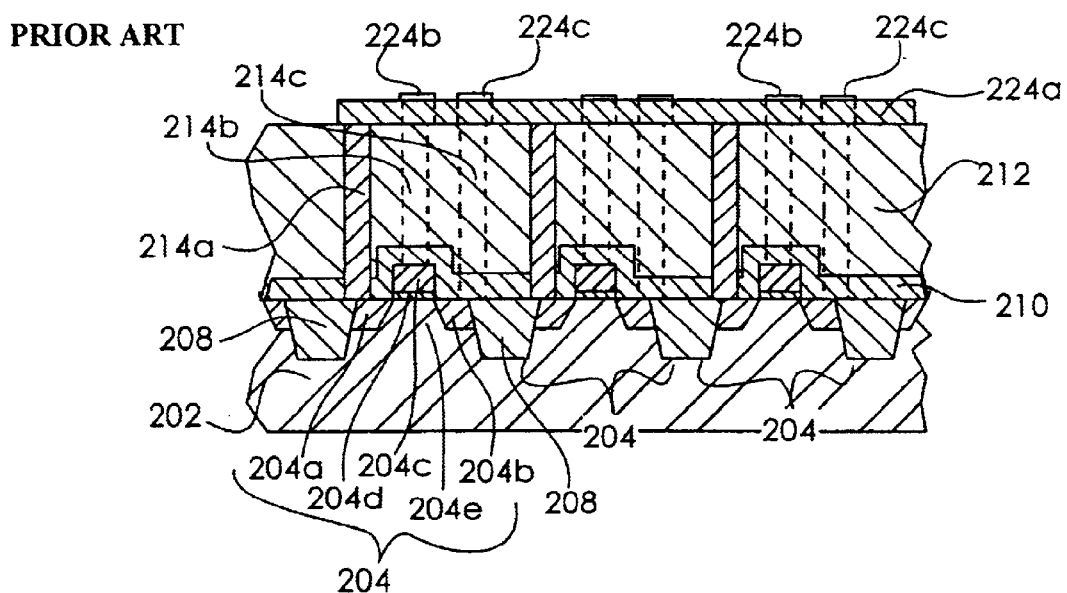
FIG. 33 is a cross-sectional view of the conventional integrated circuit device as viewed in the form of a section taken along XXXIII—XXXIII of FIG. 32.

Referring to FIG. 29, the etching stopper layers 42 exposed by the upper through holes 46a and the through holes 56a are removed to expose the lower connecting conductors 44b and the local wirings 52. The result of such a process step is shown in FIG. 29.

Next, the titanium film, the titanium nitride film and the tungsten film are successively laminated from the surface of the upper interlayer insulating film 26 to thereby form the high melting-point metal complex film comprised of the titanium film, titanium nitride film and tungsten film on the surfaces of the lower connecting conductors 44b, the local wirings 52 and the upper interlayer insulating film 26 through the through holes 46a and the through holes 56a. Thus, upper electrode layers 28, upper connecting conductors 46b and connecting conductors 56b are formed in the same process step by photolithography and etching. The result of such a process step leads to the semiconductor integrated circuit 60 shown in FIG. 23.

The upper electrode layers 28, the upper connecting conductors 46b and the connecting conductors 56b may be formed in the same process step using an aluminum material film.

While the semiconductor integrated circuit 60 according to the fourth embodiment is approximately identical to the semiconductor integrated circuit 50 according to the third embodiment in configuration, the etching stopper layer 42 is provided between the lower interlayer insulating film 20 and the upper interlayer insulating film 26, and the contact holes corresponding to two layers of the lower contact holes 44 defined in the lower interlayer insulating film 20, and the upper contact holes 46 defined in the upper interlayer insulating film 26 and the etching stopper layer 42 are provided as an alternative to the contact holes 30 of the semiconductor integrated circuit 50.

Thus, the semiconductor integrated circuit 60 according to the fourth embodiment has an effect similar to the semiconductor integrated circuit 50 according to the third embodiment in a manner similar to the case where the semiconductor integrated circuit 20 according to the second embodiment has an effect similar to the semiconductor integrated circuit 10 according to the first embodiment.

Namely, the semiconductor integrated circuit 60 becomes easy to form each opening by etching with a decrease in the aspect ratio of the opening of each contact hole in addition to the effect of the semiconductor integrated circuit 50. Thus, the lower contact holes 44 and the upper contact holes 46 can reliably be defined. In its turn, the yield of the semiconductor integrated circuit 60 is improved.

Incidentally, while each of the second embodiment and the fourth embodiment has a configuration in which the etching stopper layer 42 is provided, it may take such a configuration that the etching stopper layer 42 is not used, in order to simplify the process.

Since the semiconductor device according to the present invention and the manufacturing method thereof include such configurations or process steps as described above, the following advantageous effects are brought about.

The semiconductor device according to the present invention includes a semiconductor substrate having one main surface, a first semiconductor element having source and drain regions provided on the main surface of the semiconductor substrate, and a gate electrode provided on an active region lying between the source and drain regions with an insulating film interposed therebetween, a second semiconductor element provided with each of isolation regions being interposed between the first semiconductor element and the second semiconductor element, having source and drain regions provided on the main surface of the semiconductor substrate, and a gate electrode provided on an active region lying between the source and drain regions with an insulating film interposed therebetween, a first insulating film which is provided on the semiconductor substrate with the first and second semiconductor elements interposed therebetween and has a through hole extending via the source region or drain region of the first semiconductor element and the source region or drain region of the second semiconductor element, a first wiring layer which is buried in the through hole of the first insulating film and connects the source region or drain region of the first semiconductor element and the source region or drain region of the second semiconductor element, and a second insulating film which covers the first wiring layer and is provided on the first insulating film, and which has a surface on which second wiring layers are provided. Since the first wiring layer connecting the source region or drain region of the first semiconductor element and the source region or drain region of the second semiconductor element is covered with the second insulating film owing to such a configuration, the wiring-to-wiring pitch between the second wiring layers can be rendered wide. It is therefore possible to prevent a yield reduction due to the failure of the formation of each second wiring layer. In its turn, an inexpensive and high-reliable semiconductor device can be constructed.

Further, the first semiconductor element and the second semiconductor element are of conductive type semiconductor elements different from each other. The first wiring layer connects the source region of one of the first and second semiconductor elements and the drain region of the other thereof and is further connected to the gate electrode of one semiconductor element. Owing to such a configuration, the wiring-to-wiring pitch between the second wiring layers can be widened in a semiconductor device having a CMOS configuration. It is therefore possible to prevent a yield reduction duet to a failure in the formation of each second wiring layer. In its turn, a semiconductor device having a CMOS configuration can be constructed which is high in reliability at low cost.

Furthermore, the source and drain regions placed on the sides disconnected from the first wiring layer for the first and second semiconductor elements are respectively connected to the second wiring layers provided on the second insulating film through contact holes by conductors continuous in material in the neighborhood of a boundary face between the first and second insulating films. Owing to such a configuration, the conductors for connecting the second wiring layers and the source and drain regions can be formed in one process and hence the contact holes can be simply defined. In its turn, an inexpensive semiconductor device can be provided.

Still further, a third insulating film having an etching rate lower than an etching rate of the second insulating film etched by an etching medium is further provided between the first insulating film and the second insulating film. In addition, the source and drain regions placed on the sides disconnected from the first wiring layer for the first and second semiconductor elements are respectively connected to the second wiring layers provided on the second insulating film by both conductors provided in first contact holes defined in the first insulating film and conductors provided in second contact holes defined in the second insulating film and the third insulating film. Since the depth of the through hole of the first contact hole becomes shallow owing to such a configuration, control on the etching for forming such a through hole becomes easy and the source and drain regions suffer less damage upon their etching. Therefore, current leaks developed in the source/drain regions connected to the first contact holes decrease, thus improving device characteristics. With a decrease in the aspect ratio of each of the through holes of the first and second contact holes, etching-based opening is facilitated. Therefore, the first and second contact holes can reliably be formed. In its turn, a semiconductor device can be provided which is high in yield and inexpensive.

Still further, the first semiconductor element and the second semiconductor element are of the same conductive type semiconductor elements, and the first wiring layer is connected to both source regions of the first and second semiconductor elements or both drain regions thereof. Owing to such a configuration, a wiring-to-wiring pitch between the second wiring layers can be made wide in a semiconductor device wherein the same conductive type elements are arranged so as to adjoin each other. Further, the source regions or the drain regions can be connected to each other by each of common wirings low in resistance. It is therefore possible to prevent degradation in device characteristic, such as a reduction in the speed due to an increase in time constant and a decrease in drive current of each transistor. In its turn, a high-reliable and yield-enhanced semiconductor device can be provided.

Still further, the source or drain region placed on the side disconnected from the first wiring layer for the first and second semiconductor elements is connected to its corresponding second wiring layer provided on the second insulating film through a contact hole by a conductor continuous in material in the neighborhood of a boundary face between the first and second insulating films. Owing to the above configuration, each conductor for connecting the second wiring layer and the source region or the drain region can be formed in one process, and the contact hole can be brought to a simple configuration. In its turn, an inexpensive semiconductor device can be provided.

Still further, a third insulating film having an etching rate lower than an etching rate of the second insulating film etched by an etching medium is further provided between the first insulating film and the second insulating film, and the source region or drain region on the side disconnected from the first wiring layer for the first and second semiconductor elements is connected to the corresponding second wiring layer provided on the second insulating film by both a conductor provided in a first contact hole defined in the first insulating film and a conductor provided in a second contact hole defined in the second and third insulating films. Since the depth of a through hole of the first contact hole becomes shallow owing to such a configuration, control on the etching for forming such a through hole becomes easy. It is also possible to less reduce damage developed upon etching of the source or drain region. Therefore, current leaks developed in the source/drain regions connected to the first contact holes decrease, thus improving device characteristics. With a decrease in the aspect ratio of each of the through holes of the first and second contact holes, the opening is facilitated. Therefore, the first and second contact holes can reliably be defined. In its turn, a semiconductor device can be provided which is high in yield and inexpensive.

A method of manufacturing a semiconductor device, according to the present invention includes a first step for forming source and drain regions of a first semiconductor element and source and drain regions of a second semiconductor element in one main surface of a semiconductor substrate with isolation regions being interposed therebetween, and forming gate electrodes on active regions respectively interposed between the source regions and drain regions of the first and second semiconductor elements with insulating films being interposed therebetween, thereby forming the first and second semiconductor elements, a second step for forming a first insulating film on the semiconductor substrate with the first and second semiconductor elements being interposed therebetween, a third step for defining in the first insulating film, a through hole which is opposed to the main surface of the semiconductor substrate and extends via the source or drain region of the first semiconductor element and the source or drain region of the second semiconductor element, a fourth step for the first wiring layer into the corresponding through hole and connecting the source or drain region of the first semiconductor element and the source or drain region of the second semiconductor element by the embedded first wiring layer, and a fifth step for forming a second insulating film on the first wiring layer and the first insulating film and forming second wiring layers on the surface of the second insulating film. Therefore, the wiring-to-wiring pitch between the second wiring layers can be made wider, and etching can be done without leaving metal residuals behind upon etching the second wiring layers. It is therefore possible to prevent a yield reduction due to a failure in the formation of each second wiring layer. In its turn, an inexpensive and high-reliable semiconductor device can be manufactured in a simple process.

Further, the first semiconductor element and the second semiconductor element are of conductive type semiconductor elements different from each other. The third step includes a step for allowing the through hole to extend via the source region of one of the first and second semiconductor elements and the drain region of the other thereof and further causing the through hole to extend to the gate electrode of the one thereof. Therefore, etching can be done without leaving metal residuals behind upon etching each second wiring layers of a semiconductor device having a CMOS configuration. It is therefore possible to prevent a yield reduction due to a failure in the formation of each second wiring layer. In its turn, an inexpensive and high-reliable semiconductor device having a CMOS configuration can be manufactured in a simple process.

Furthermore, the fifth step further includes a step for forming contact holes to the source and drain regions on the sides disconnected from the first wiring layer for the first and second semiconductor elements from the surface of the second insulating film and connecting the source and drain regions to the second wiring layers on the second insulating film by conductors through the contact holes. Therefore, the conductors for connecting the second wiring layers and the source and drain regions can be formed in one process, and the contact holes can be defined in a simple process. In its turn, an inexpensive semiconductor device can be manufactured in a simple process.

Still further, the third step includes a step for defining first contact holes to the source and drain regions placed on the sides unopposed to the through hole for the first and second semiconductor elements, the fourth step includes a step for embedding conductors in the first contact holes, and further the fifth step includes a step for forming a third insulating film having an etching rate lower than an etching rate of the second insulating film etched by an etching medium between the first insulating film and the second insulating film, defining second contact holes connected to the first contact holes in the second and third insulating films and connecting the conductors buried in the first contact holes and the second wiring layers by conductors through the second contact holes. Therefore, the depth of the through hole of each first contact hole becomes shallow and control on the etching for forming the through hole becomes easy. It is therefore possible to carry out etching for less reducing damage applied to the source and drain regions. The formation of the openings can easily be carried out owing to a decrease in the aspect ratio of the through hole for each of the first and second contact holes. It is therefore possible to manufacture, in a simple process, a semiconductor device which reduces current leaks developed in the source/drain regions each connected to the first contact hole and has excellent device characteristics and contact holes high in reliability. In its turn, a semiconductor device high in yield and inexpensive can be manufactured in a simple process.

Still further, the first and second semiconductor elements are of the same conductive type semiconductor elements. In the third step, the through holes are used to connect the source regions or drain regions of the first and second semiconductor elements to one another. Etching can be done without leaving metal residuals upon etching the second wiring layers of the semiconductor device. It is therefore possible to prevent a yield reduction due to a failure in the formation of each second wiring layer. In its turn, an inexpensive and high-reliable semiconductor device wherein the same conductive type elements are arranged so as to adjoin each other, can be manufactured in a simple process.

Still further, the fifth step further includes a step for defining contact holes to the source or drain region placed on the side disconnected from the first wiring layer for the first and second semiconductor elements, and the first wiring layer from the surface of the second insulating film and connecting the source or drain region and the first wiring layer to their corresponding second wiring layers on the second insulating film by conductors through the contact holes. Therefore, the conductors for connecting the second wiring layers and the source region or drain region can be formed in one process, and the contact holes can be defined in a simple process. In its turn, an inexpensive semiconductor device can be manufactured in a simple process.

Still further, the third step includes a step for defining first contact holes to the source or drain region placed on the side unopposed to the through hole for the first and second semiconductor elements, the fourth step includes a step for embedding a conductor in the first contact hole, and further the fifth step includes a step for forming a third insulating film having an etching rate lower than an etching rate of the second insulating film etched by an etching medium between the first insulating film and the second insulating film, defining a second contact hole connected to the first contact hole and the through hole in the second and third insulating films and connecting the conductor buried in the first contact hole and the first and second wiring layers by conductors through the second contact hole. Therefore, the depth of the through hole of each first contact hole becomes shallow and control on the etching for forming each through hole becomes easy. It is therefore possible to carry out etching for less reducing damage applied to the source or drain region. The formation of the openings can easily be carried out owing to a decrease in the aspect ratio of the through hole for each of the first and second contact holes. It is therefore possible to manufacture, in a simple process, a semiconductor device which reduces current leaks developed in the source/drain regions each connected to the first contact hole and has excellent device characteristics and contact holes high in reliability. In its turn, a semiconductor device high in yield and inexpensive can be manufactured in a simple process.

While the presently preferred embodiments of the present invention have been shown and described. It is to be understood these disclosures are for the purpose of illustration and that various changes and modifications may be made without departing from the scope of the invention as set forth in the appended claims.

What is claimed is:

1. A semiconductor device comprising:
   a semiconductor substrate having one main surface;
   a first semiconductor element having source and drain regions provided on the main surface of said semiconductor substrate, and a gate electrode provided on an active region lying between the source and drain regions with an insulating film interposed therebetween;
   a second semiconductor element provided with each of isolation regions being interposed between said first semiconductor element and said second semiconductor element, having source and drain regions provided on the main surface of said semiconductor substrate, and a gate electrode provided on an active region lying between the source and drain regions with an insulating film interposed therebetween;

a first insulating film which is provided on said semiconductor substrate with said first and second semiconductor elements interposed therebetween and has a through hole extending via the source region or drain region of said first semiconductor element and the source region or drain region of said second semiconductor element;

a first wiring layer which is buried in the through hole of said first insulating film and connects the source region or drain region of said first semiconductor element and the source region or drain region of said second semiconductor element; and a second insulating film which covers said first wiring layer and is provided on said first insulating film, and which has a surface on which second wiring layers are provided.

2. The semiconductor device according to claim 1, wherein the first semiconductor element and the second semiconductor element are of conductive type semiconductor elements different from each other, and the first wiring layer connects the source region of one of the first and second semiconductor elements and the drain region of the other thereof and is further connected to the gate electrode of said one semiconductor element.

3. The semiconductor device according to claim 2, wherein the source and drain regions placed on the sides disconnected from the first wiring layer for the first and second semiconductor elements are respectively connected to the second wiring layers provided on the second insulating film through contact holes by conductors continuous in material in the neighborhood of a boundary face between the first and second insulating films.

4. The semiconductor device according to claim 2, wherein a third insulating film having an etching rate lower than an etching rate of the second insulating film etched by an etching medium is further provided between the first insulating film and the second insulating film, and the source and drain regions placed on the sides disconnected from the first wiring layer for the first and second semiconductor elements are respectively connected to the second wiring layers provided on the second insulating film by both conductors provided in first contact holes defined in the first insulating film and conductors provided in second contact holes defined in the second insulating film and the third insulating film.

5. The semiconductor device according to claim 1, wherein the first semiconductor element and the second semiconductor element are of the same conductive type semiconductor elements, and the first wiring layer is connected to both source regions of the first and second semiconductor elements or both drain regions thereof.

6. The semiconductor device according to claim 5, wherein the source or drain region placed on the side disconnected from the first wiring layer for the first and second semiconductor elements is connected to the corresponding second wiring layer provided on the second insulating film through a contact hole by a conductor continuous in material in the neighborhood of a boundary face between the first and second insulating films.

7. The semiconductor device according to claim 5, wherein a third insulating film having an etching rate lower than an etching rate of the second insulating film etched by an etching medium is further provided between the first insulating film and the second insulating film, and the source region or drain region on the side disconnected from the first wiring layer for the first and second semiconductor elements is connected to the corresponding second wiring layer provided on the second insulating film by both a conductor provided in a first contact hole defined in the first insulating film and a conductor provided in a second contact hole defined in each of the second and third insulating films.

* * * * *